(12) United States Patent
Lee et al.

(10) Patent No.: US 10,586,941 B2
(45) Date of Patent: Mar. 10, 2020

(54) FOLDABLE DISPLAY DEVICE

(71) Applicant: SAMSUNG DISPLAY CO., LTD., Yongin-si, Gyeonggi-do (KR)

(72) Inventors: Jihwa Lee, Hwaseong-si (KR); Jinkyu Kim, Cheongju-si (KR); Minju Oh, Gimhae-si (KR); Jeongkug Lee, Seoul (KR); Chansong Lee, Suwon-si (KR); Hyoungwook Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 487 days.

(21) Appl. No.: 15/237,481

(22) Filed: Aug. 15, 2016

(65) Prior Publication Data
US 2017/0200915 A1    Jul. 13, 2017

(30) Foreign Application Priority Data

Jan. 11, 2016 (KR) .................. 10-2016-0003273

(51) Int. Cl.
*H01L 51/52* (2006.01)
*H01L 51/00* (2006.01)
(Continued)

(52) U.S. Cl.
CPC ........ *H01L 51/5237* (2013.01); *G02B 5/3033* (2013.01); *G06F 3/0412* (2013.01);
(Continued)

(58) Field of Classification Search
CPC ............. H01L 51/5237; H01L 51/0097; H01L 51/5253; H01L 51/5281; H01L 27/323;
(Continued)

(56) References Cited

U.S. PATENT DOCUMENTS

2013/0224416 A1* 8/2013 Cho ................. C09J 183/04
428/40.9
2014/0178622 A1 6/2014 Fuchi et al.
(Continued)

FOREIGN PATENT DOCUMENTS

KR    10-1267776 B1    5/2013
KR    10-1279257 B1    6/2013
(Continued)

*Primary Examiner* — Eli D. Strah
(74) *Attorney, Agent, or Firm* — Lewis Roca Rothgerber Christie LLP

(57) ABSTRACT

A foldable display device includes a display panel, a polarizing member on the display panel, a window on the polarizing member, a first adhesive member between the display panel and the polarizing member, and a second adhesive member between the polarizing member and the window. In a first state, the display panel, the polarizing member, the window, the first adhesive member, and the second adhesive member are bent along a bending axis such that the window is closer to the bending axis than the display panel is. The first and second adhesive members have a storage modulus in a range of about $5 \times 10^4$ Pa to about $5 \times 10^5$ Pa at about $-25°$ C. The second adhesive member has a storage modulus in a range of about $4.5 \times 10^4$ Pa to about $6.5 \times 10^4$ Pa at about $60°$ C. The first adhesive member has a stress-relaxation ratio greater than about 40 and less than about 50.

16 Claims, 15 Drawing Sheets

(51) Int. Cl.
*G02B 5/30* (2006.01)
*G06F 3/041* (2006.01)
*H01L 27/32* (2006.01)
*H05K 1/02* (2006.01)
*H05K 5/00* (2006.01)
*C09J 143/04* (2006.01)
*C09J 183/04* (2006.01)
*G02F 1/1333* (2006.01)

(52) U.S. Cl.
CPC ........ *H01L 27/323* (2013.01); *H01L 51/0097* (2013.01); *H01L 51/5253* (2013.01); *H01L 51/5281* (2013.01); *H05K 1/028* (2013.01); *H05K 5/0017* (2013.01); *B32B 2307/51* (2013.01); *B32B 2307/54* (2013.01); *B32B 2307/548* (2013.01); *B32B 2457/20* (2013.01); *B32B 2457/206* (2013.01); *B32B 2457/208* (2013.01); *C09J 143/04* (2013.01); *C09J 183/04* (2013.01); *G02F 1/133305* (2013.01); *G06F 2203/04102* (2013.01); *H01L 2251/5338* (2013.01); *Y02E 10/549* (2013.01); *Y10T 428/1059* (2015.01); *Y10T 428/1068* (2015.01)

(58) Field of Classification Search
CPC ......... H01L 2251/5338; H01L 27/1218; H01L 27/1255; H01L 27/3232; H05K 1/028; H05K 5/0017; G06F 3/0412; G06F 2203/04102; G02B 5/3033; B32B 2307/54; B32B 2307/548; B32B 2307/51; B32B 2457/20; B32B 2457/206; B32B 2457/208; G02F 1/133305; C09J 183/04; C09J 143/04; Y10T 428/1059; Y10T 428/1068; Y02E 10/549

See application file for complete search history.

(56) References Cited

U.S. PATENT DOCUMENTS

| | | | | |
|---|---|---|---|---|
| 2014/0295150 | A1* | 10/2014 | Bower | ........................ C09J 5/00 428/201 |
| 2015/0268697 | A1* | 9/2015 | Nam | ..................... G06F 1/1652 428/157 |
| 2015/0346408 | A1* | 12/2015 | Mizutani | ................ C09J 133/08 428/41.5 |
| 2016/0122600 | A1* | 5/2016 | Moon | .................... C09J 133/14 428/354 |

FOREIGN PATENT DOCUMENTS

| | | |
|---|---|---|
| KR | 10-1399987 B1 | 5/2014 |
| KR | 10-2014-0140944 A | 12/2014 |
| KR | 10-2014-0142004 A | 12/2014 |
| KR | 10-2015-0016917 A | 2/2015 |
| KR | 10-2015-0048220 A | 5/2015 |

* cited by examiner

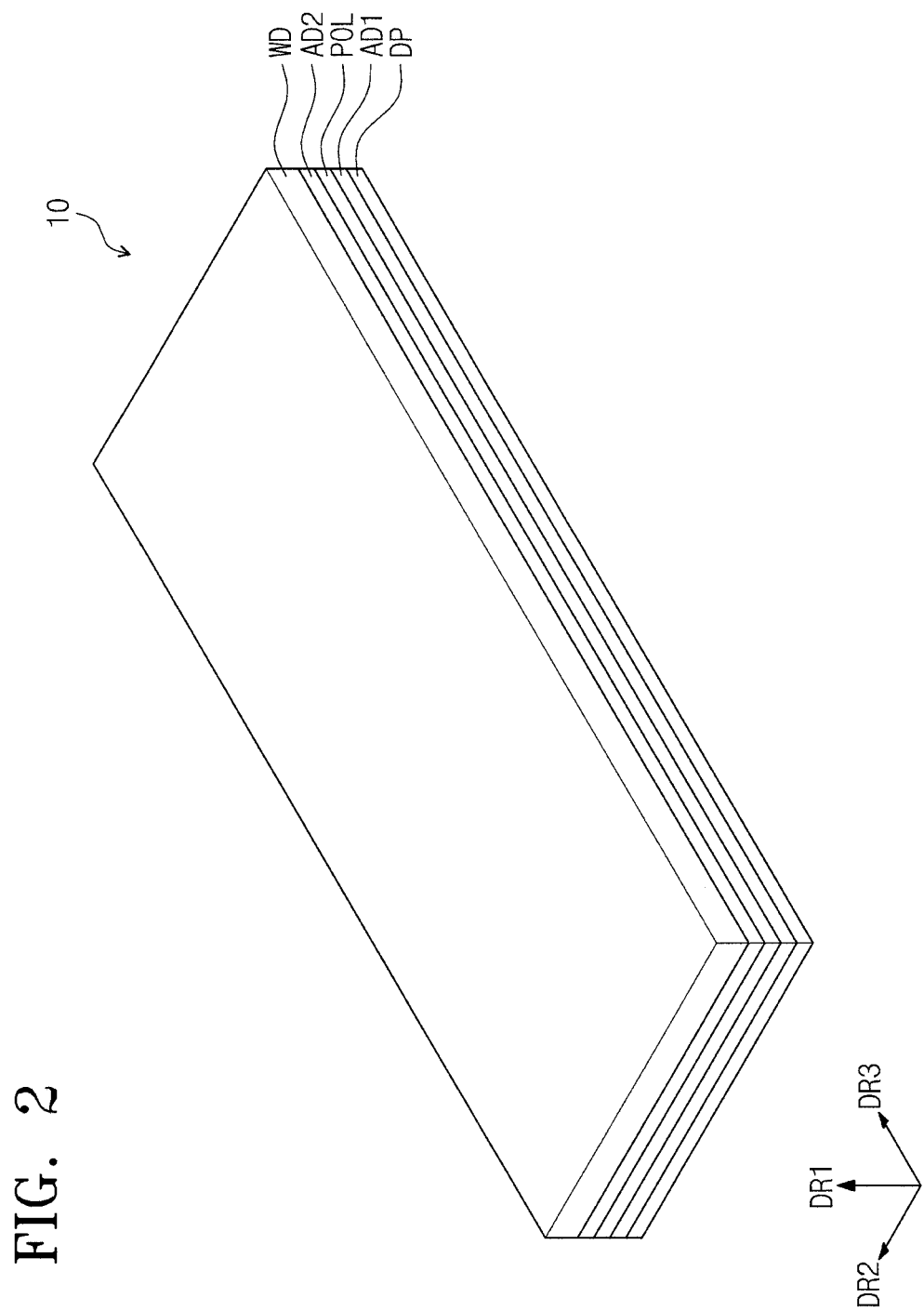

FOLDABLE DISPLAY DEVICE

CROSS-REFERENCE TO RELATED APPLICATION

This U.S. non-provisional patent application claims priority under 35 U.S.C. § 119 to and the benefit of Korean Patent Application No. 10-2016-0003273, filed on Jan. 11, 2016 in the Korean Intellectual Property Office, the entire content of which is hereby incorporated by reference.

BACKGROUND

1. Field

Aspects of the present disclosure relate to a foldable display device.

2. Description of the Related Art

A display device provides information to a user by displaying various images on a display screen. Recently, display devices capable of bending (e.g., bendable or flexible display devices) are being developed. Different from a typical flat panel display device, a flexible display device may be folded, rolled, or bent like paper. The flexible display device, the shape of which may be modified in various ways, is easily carried and may provide improved convenience for the user. Flexible displays may be rollable displays, foldable displays, or the like.

SUMMARY

Embodiments of the present invention provide a foldable display device having improved durability under relatively high temperature/high humidity conditions.

The present invention also provides a foldable display device in which a rate of peeling under relatively high temperature/high humidity conditions may be reduced.

An embodiment of the present disclosure provides a foldable display device including: a display panel; a polarizing member on the display panel; a window on the polarizing member; a first adhesive member between the display panel and the polarizing member; and a second adhesive member between the polarizing member and the window. In a first state, the display panel, the polarizing member, the window, the first adhesive member, and the second adhesive member are bent along a bending axis such that the window is closer to the bending axis than the display panel is. Each of the first adhesive member and the second adhesive member has a storage modulus in a range of about $5 \times 10^4$ Pa to about $5 \times 10^5$ Pa at about −25° C., the second adhesive member has a storage modulus in a range of about $4.5 \times 10^4$ Pa to about $6.5 \times 10^4$ Pa at about 60° C. The first adhesive member has a stress-relaxation ratio that is greater than about 40 and less than about 50, the stress-relaxation ratio being defined by Formula 1:

$$\text{Stress-relaxation ratio (\%)} = 100 \times G(t2)/G(t1) \quad \text{[Formula 1]}$$

In Formula 1, G(t1) is an initial stress-relaxation modulus measured in a state in which the first adhesive member is about 600 μm thick, the initial stress-relaxation modulus being measured with a rheometer in a stress-relaxation test mode when a strain of about 25% is removed after being applied using a parallel plate for about 100 seconds at about 60° C., and G(t2) is a stress-relaxation modulus measured after the strain is applied to the first adhesive member for about 300 seconds.

In an embodiment, the display panel, the polarizing member, the window, the first adhesive member, and the second adhesive member may be unbent in a second mode.

In an embodiment, the first adhesive member may have a residual strain in a range of about 5 to about 8 at about 60° C., and the residual strain may be defined by Formula 2:

$$\text{Residual strain (\%)} = L2/L1 \times 100 \quad \text{[Formula 2]}$$

In Formula 2, L1 is a maximum creep strain in which the state in which the first adhesive member is about 600 μm thick and when a stress of about 2000 Pa is applied to the first adhesive member for about 1 hour at about 60° C. using a rheometer. L2 is an unrecovered residual recovery strain that remains along with elastic recovery strain that is recovered when the applied stress is removed after achieving the maximum creep strain.

In an embodiment, the first adhesive member may have a thickness in a range of about 25 μm to about 100 μm.

In an embodiment, the second adhesive member may have a thickness in a range of about 25 μm to about 100 μm.

In an embodiment, the first adhesive member may have a peel strength of at least about 800 gf/in.

In an embodiment, the second adhesive member may have a peel strength of at least about 800 gf/in.

In an embodiment, the first adhesive member may include a first silicone-based base polymer, a first adhesion imparting agent, and a first cross-linking agent, and the second adhesive member may include a second silicone-based base polymer, a second adhesion imparting agent, and a second cross-linking agent.

In an embodiment, the foldable display device may further include: a protective film below the display panel; and a third adhesive member between the display panel and the protective film. In the first state, the protective film and the third adhesive member may be bent along the bending axis and, in a second state, may be unbent.

In an embodiment, a thickness of the third adhesive may be less than a thickness of each of the first adhesive member and the second adhesive member.

In an embodiment, the third adhesive member may have a storage modulus in a range of about $5 \times 10^4$ Pa to about $5 \times 10^5$ Pa at about −25° C.

In an embodiment, the foldable display device may further include a touch sensing unit between the polarizing member and the window. In the first state, the touch sensing unit may bent along the bending axis and, in a second state, may be unbent.

In an embodiment, the touch sensing unit may directly contact the polarizing member.

In an embodiment, the foldable display device may further include: a fourth adhesive member between the polarizing member and the touch sensing unit. In the first state, the fourth adhesive member may be bent along the bending axis and, in the second state, may be unbent.

In an embodiment, a thickness of the fourth adhesive member may be less than a thickness of each of the first adhesive member and the second adhesive member.

In an embodiment, the fourth adhesive member may have a storage modulus in a range of about $5 \times 10^4$ Pa to about $5 \times 10^5$ Pa at about −25° C.

BRIEF DESCRIPTION OF THE FIGURES

FIG. 2 is a schematic perspective view of the foldable display device shown in FIG. 1 in an unbent state according to an embodiment of the present disclosure;

DETAILED DESCRIPTION

Figure 1:
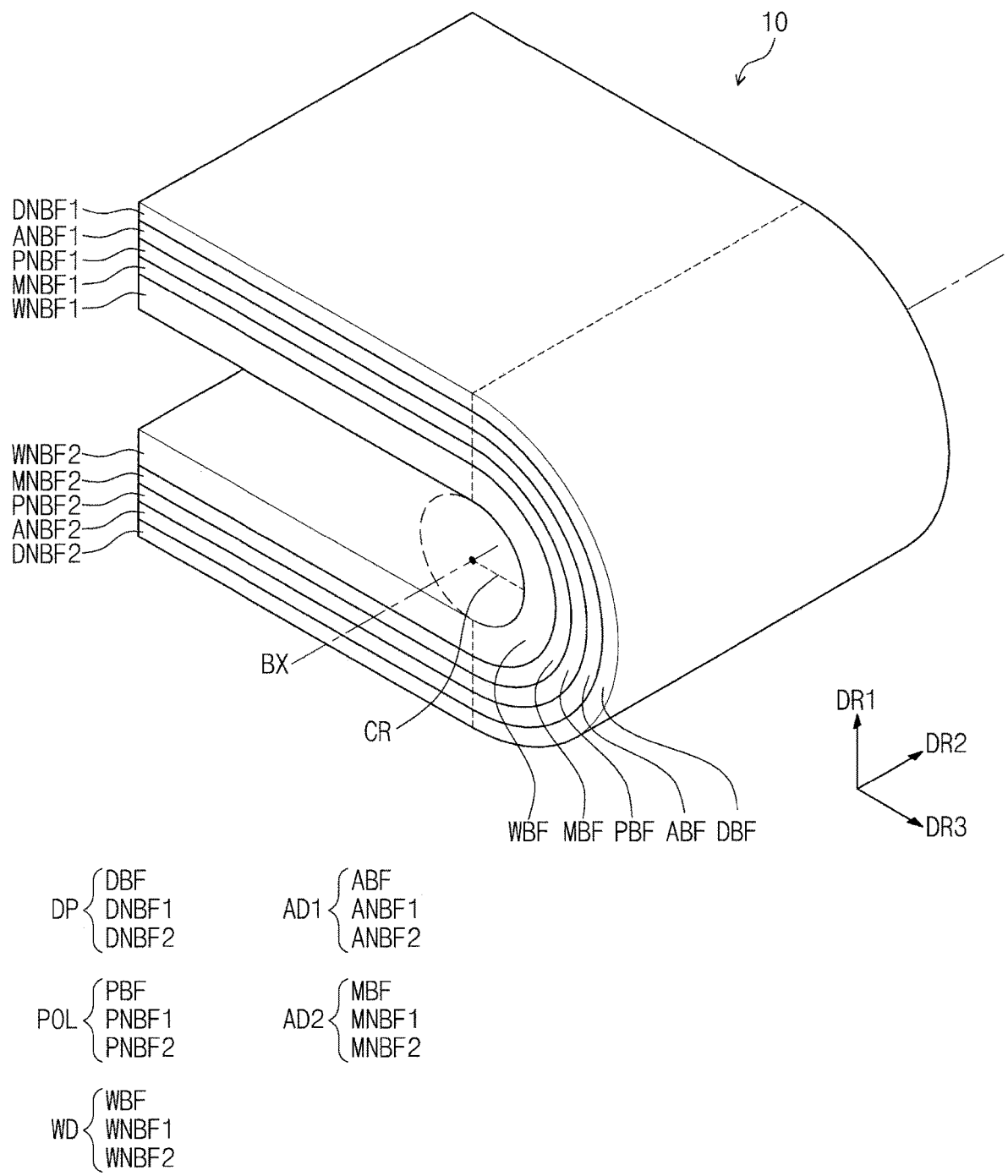
FIG. 1 is a schematic perspective view of a foldable display device in a bent state according to an embodiment of the present disclosure.

Aspects and features of the present disclosure that are described above, and other aspects and features of the present disclosure, will be more easily understood through the accompanying drawings and related exemplary embodiments. However, the present disclosure should not be construed as being limited to the exemplary embodiments set forth herein. Rather, these exemplary embodiments are provided so that this disclosure will be thorough and complete and will fully convey the scope of the present disclosure to those skilled in the art. The present disclosure may be embodied in different forms.

In describing the drawings, like reference numerals refer to like elements. In the accompanying drawings, dimensions of an element may be changed (e.g., enlarged) for more effective description thereof, and the present disclosure should not be limited thereto. It will be understood that, although the terms first, second, etc. may be used herein to describe various elements, the elements should not be limited by these terms. These terms are only used to distinguish one element from another element. For example, a first element could be termed a second element and a second element could be termed a first element without departing from the teachings of the present invention. As used herein, the singular forms "a" and "an" are intended to include the plural forms as well, unless the context clearly indicates otherwise.

It will be understood that the terms "comprises," "comprising," "includes," and/or "including," when used in this specification, specify the presence of the stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Further, it will be understood that when an element, such as a layer, a film, an area, or a plate, is referred to as being "below" another element, it can be "directly below" the other element or intervening elements may also be present.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, a foldable display device according to one or more embodiments of the present disclosure will be described.

FIG. 1 is a schematic perspective view of a foldable display device in a bent state according to an embodiment of the present disclosure. FIG. 2 is a perspective view of the foldable display device shown in FIG. 1 in an unbent state according to an embodiment of the present disclosure.

Referring to FIGS. 1 and 2, a foldable display device 10 according to an embodiment of the present disclosure includes a display panel DP, a polarizing member POL provided on the display panel DP, a window WD provided on the polarizing member POL, a first adhesive member AD1 provided between the display panel DP and the polarizing member POL, and a second adhesive member AD2 provided between the polarizing member POL and the window WD. The display panel DP, the first adhesive member AD1, the polarizing member POL, the second adhesive member AD2, and the window WD are successively laminated in (e.g., are stacked in), for example, a first direction DR1.

The foldable display device 10 according to an embodiment of the present disclosure may operate in a first mode and a second mode (e.g., may enter a bent state and an unbent state). In the first mode (e.g., in the bent state), each of the display panel DP, the first adhesive AD1, the polarizing member POL, the second adhesive member AD2, and the window WD is bent along a bending axis BX that extends in a second direction DR2. In the second mode (e.g., in the unbent state), each of the display panel DP, the first adhesive AD1, the polarizing member POL, the second adhesive member AD2, and the window WD is unbent (e.g., is flat or substantially flat). In the present disclosure, bending may indicate that the display panel and the like is bent to have a certain or particular shape by an external force.

In the first mode, the window WD is closer to the bending axis BX than the display panel DP is. In the first mode, the window WD is positioned at an innermost portion (e.g., the window WD is an innermost element of the foldable display device 10).

In the first mode, the foldable display device 10 according to an embodiment of the present disclosure may have a radius of curvature CR in a range of about 0.5 mm to about 2.0 mm or in a range of about 1 mm to about 10 mm.

The display panel DP may be a flexible display panel. The display panel DP may include a flexible substrate. In the present disclosure, flexibility indicates an ability to bend and may range from a completely foldable structure to a structure which can be bent on the order of about several nanometers (e.g., a structure which can only be bent about several nanometers).

The display panel DP displays images on a surface. The display panel DP includes a bending area DBF and non-bending areas DNBF1 and DNBF2. The display panel DP generates (displays) the images at the bending area DBF and at the non-bending areas DNBF1 and DNBF2 without distinction (e.g., the display panel DP may display a continuous image across the non-bending area DNBF1, the bending area DBF, and the non-bending area DNBF2). The bending area DBF is connected to (extends from) the non-bending areas DNBF1 and DNBF2. In one embodiment, the display panel DP may include a plurality of non-bending areas DNBF1 and DNBF2. In one embodiment, the display panel DP may include two non-bending areas DNBF1 and DNBF2. The non-bending areas DNBF1 and DNBF2 may include a first non-bending area DNBF1 connected to (extending from) an end of the bending area DBF and a second non-bending area DNBF2 connected to (extending from) the other end of the bending area DBF.

The bending area DBF is bent along the bending axis BX in the first mode, and the bending area DBF is unbent (e.g., is flat or substantially flat) in the second mode. In each of the first mode and the second mode, the non-bending areas DNBF1 and DNBF2 are not bent. In each of the first mode and the second mode, the non-bending areas DNBF1 and DNBF2 may be flat or slightly bent. In FIG. 1, a distance between the first non-bending area DNBF1 and the second non-bending area DNBF2 is illustrated as being constant with respect to the bending axis BX, but embodiments of the present disclosure are not limited thereto. In another embodiment, the distance between the first non-bending area DNBF1 and the second non-bending area DNBF2, which are bent to face each other, may vary. Moreover, in FIG. 1, surface areas of the first non-bending area DNBF1 and the second non-bending area DNBF2, which are bent to face each other, are illustrated as being the same as each other when the display panel DP is bent along the bending axis BX, but embodiments of the present disclosure are not limited thereto. In another embodiment, the surface areas of the first non-bending area DNBF1 and the second non-bending area DNBF2, which are bent to face each other, may be different from each other.

Figure 3A:
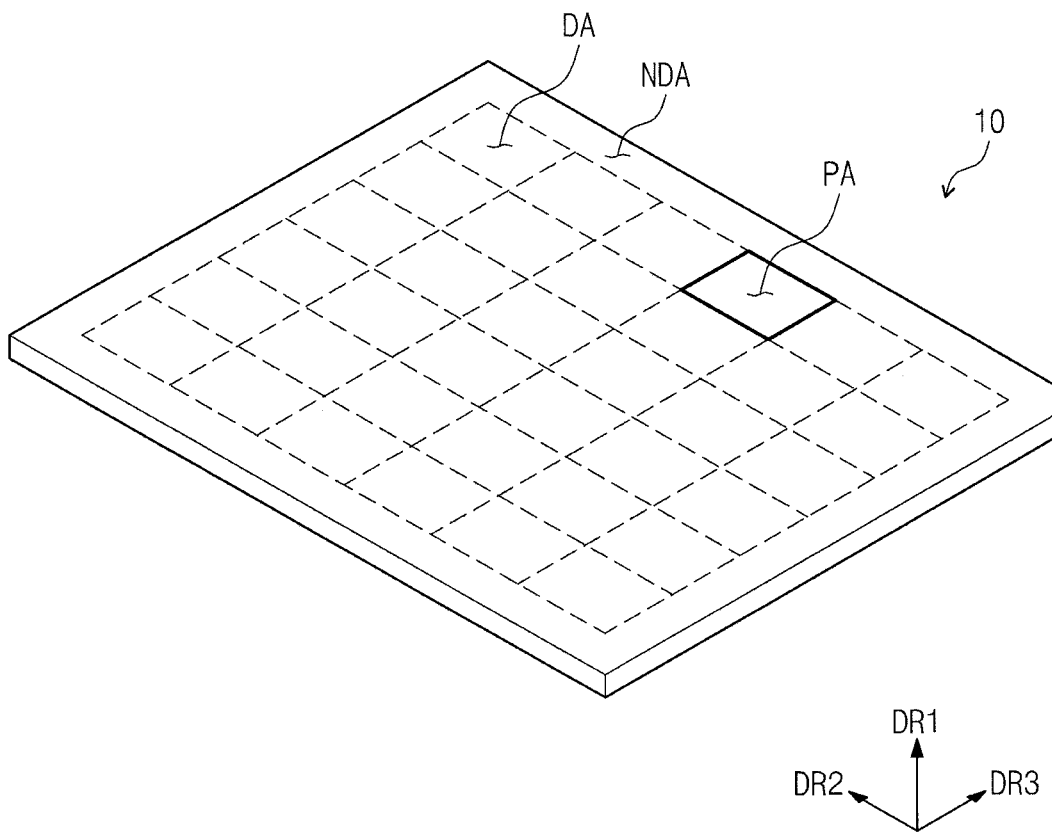
FIG. 3A is a perspective view schematically illustrating a foldable display device according to an embodiment of the present disclosure.

FIG. 3A is a perspective view schematically illustrating the foldable display device according to an embodiment of the present disclosure.

Referring to FIG. 3A, the foldable display device 10 according to an embodiment of the present disclosure includes a display area DA and a non-display area NDA. The display area DA is at where the images are displayed. When viewed in a thickness direction of the foldable display device 10 (e.g., in a plan view), the display area DA may have an approximately rectangular shape, but embodiments of the present disclosure are not limited thereto.

The display area DA includes a plurality of pixel areas PA. The pixel areas PA may be arranged in a matrix. The pixel areas PA may be defined by a pixel defining film (PDL in FIG. 3D). Each of the pixel areas PA may include a plurality of pixels (PX in FIG. 3B).

The non-display area NDA does not display an image. When the foldable display device 10 is viewed in the thickness direction (e.g., in the plan view), the non-display area NDA may, for example, surround (e.g., surround a periphery of) the display area DA.

Figure 3B:
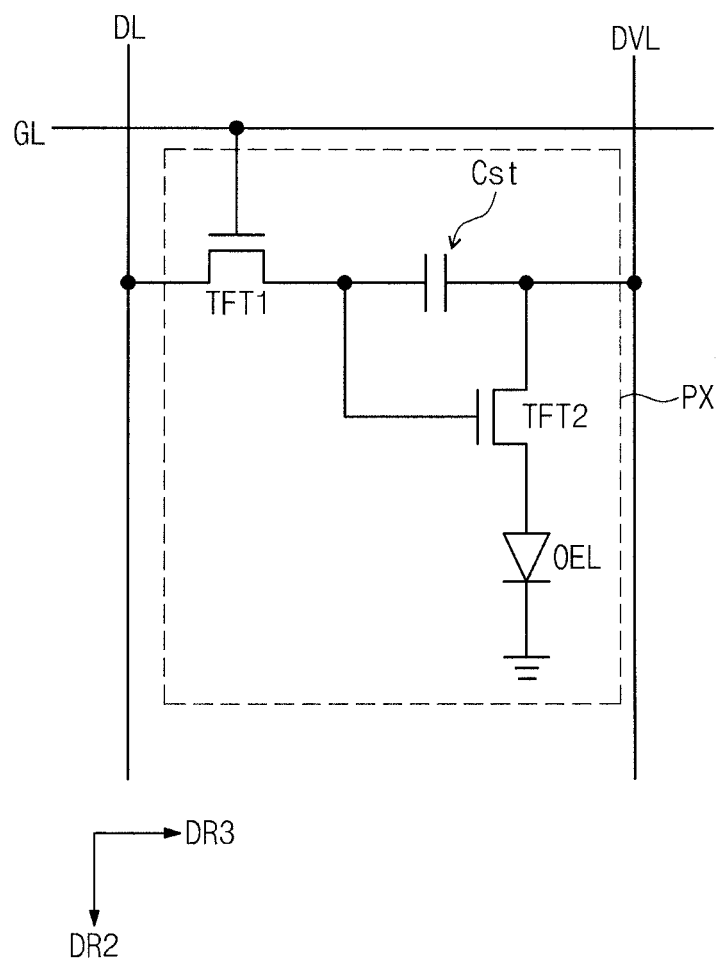
FIG. 3B is a circuit diagram of one pixel included in a foldable display device according to an embodiment of the present disclosure.
Figure 3C:
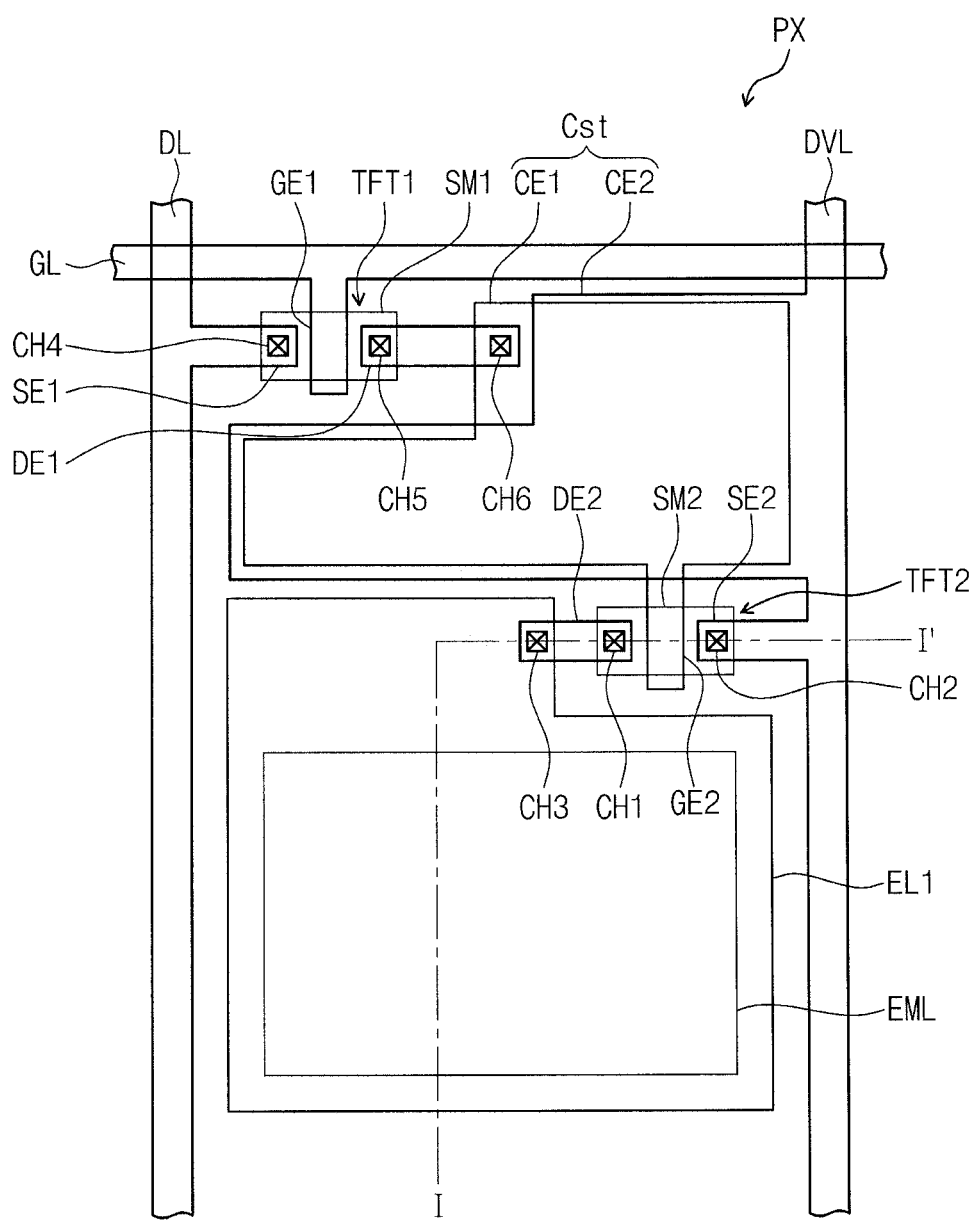
FIG. 3C is a plan view illustrating one pixel included in a foldable display device according to an embodiment of the present disclosure.
Figure 3D:
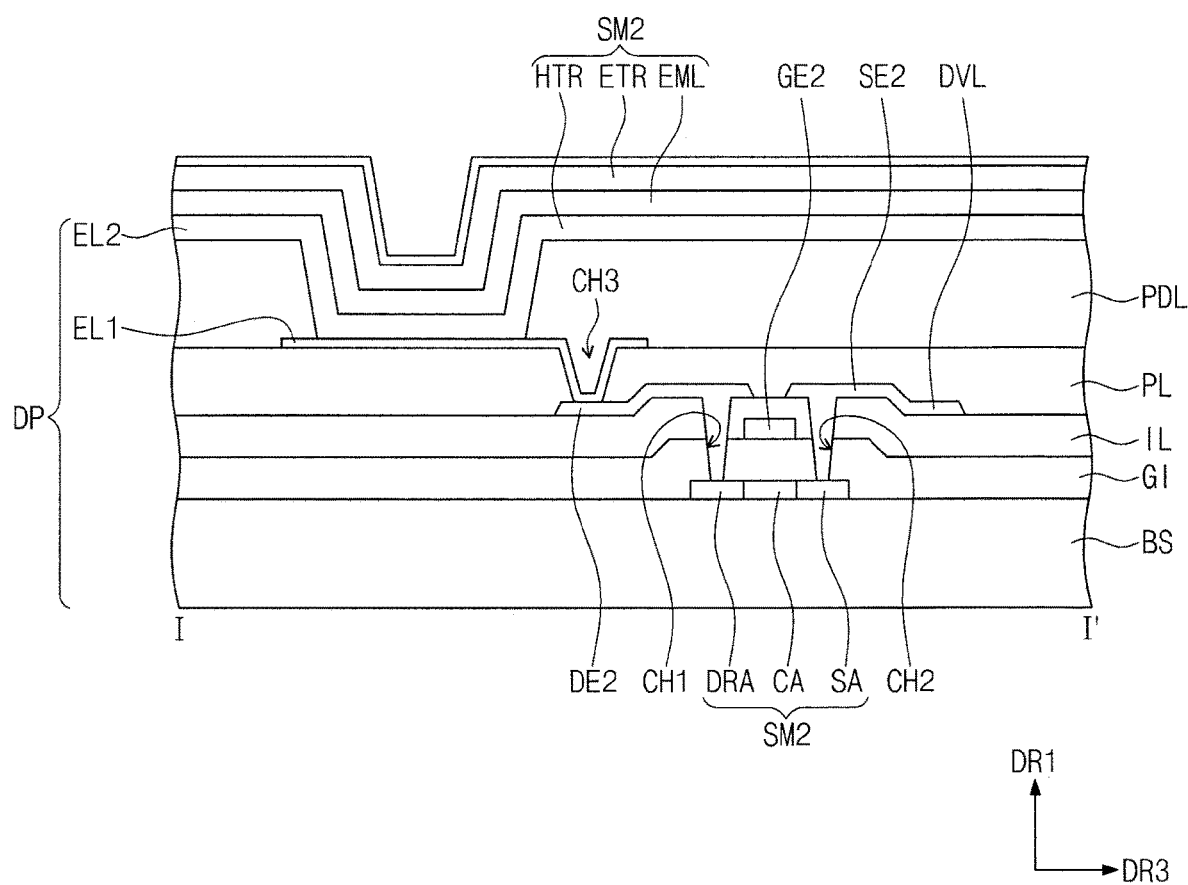
FIG. 3D is a schematic cross-sectional view taken along the line I-I' in FIG. 3C.

FIG. 3B is a circuit diagram of one of the pixels included in the foldable display device according to an embodiment of the present disclosure. FIG. 3C is a plan view illustrating one of the pixels included in the foldable display device according to an embodiment of the present disclosure. FIG. 3D is a schematic cross-sectional view taken along the line I-I' in FIG. 3C.

Hereinafter, the display panel DP is exemplarily described as an organic light emitting display panel. However, embodiments of the present disclosure are not limited thereto, and the display panel DP may be a liquid crystal display panel, a plasma display panel, a microelectromechanical system display panel, an electrowetting display panel, or the like.

Referring to FIGS. 3B and 3C, each of the pixels PX may be connected to lines, including gate lines GL, data lines DL, and driving voltage lines DVL. Each of the pixels PX includes thin film transistors TFT1 and TFT2 connected to the lines, an organic light emitting element OEL connected to the thin film transistors TFT1 and TFT2, and a capacitor Cst.

In an embodiment of the present disclosure, a single pixel is exemplarily illustrated as being connected to one of the gate lines, one of the data lines, and one of the driving voltage lines. However, embodiments of the present disclosure are not limited thereto, and a plurality of the pixels PX may be connected to one of the gate lines, one of the data lines, and one of the driving voltage lines. Moreover, a single pixel may be connected to one or more of the gate lines, one or more of the data lines, and one or more of the driving voltage lines.

The gate lines GL extend in a third direction DR3. The data lines DL extend in the second direction DR2 which crosses (e.g., intersects) the third direction DR3. The driving voltage lines DVL extend in the same or substantially the same direction as the data lines DL, for example, the second direction DR2. The gate lines GL transport (transmit) a scanning signal to the thin film transistors TFT1 and TFT2, the data lines DL transport (transmit) a data signal to the thin film transistors TFT1 and TFT2, and the driving voltage lines DVL provide (transmit) a driving voltage to the thin film transistors TFT1 and TFT2.

Each of the pixels PX may emit light having a certain color, for example, one of the pixels PX may emit a red light, a green light, or a blue light. However, the pixels PX are not limited to the above-listed colors and may, for example, emit a white light, a cyan light, a magenta light, a yellow light, or the like.

The thin film transistors TFT1 and TFT2 may include a driving thin film transistor TFT2 for controlling the organic light emitting element OEL and a switching thin film transistor TFT1 for switching the driving thin film transistor TFT2. In an embodiment of the present disclosure, each of the pixels PX is described as including the two thin film transistors TFT1 and TFT2. However, embodiments of the present disclosure are not limited thereto, and each of the pixels PX may include at least three thin film transistors and a plurality of capacitors.

The switching thin film transistor TFT1 includes a first gate electrode GE1, a first source electrode SE1, and a first drain electrode DE1. The first gate electrode GE1 is connected to the gate line(s) GL, and the first source electrode SE1 is connected to the data line(s) DL. The first drain electrode DE1 is connected to a first common electrode CE1 through a fifth contact opening CH5 (e.g., a fifth contact hole). The switching thin film transistor TFT1 transports the data signal, which is applied to the data lines according to the scanning signal applied to the gate line(s) GL, to the driving thin film transistor TFT2.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage lines DVL. The second drain electrode DE2 is connected to a first electrode EL1 through a third contact opening CH3 (e.g., a third contact hole).

The first electrode EL1 is connected to the second drain electrode DE2 of the driving thin film transistor TFT2. A common voltage is applied to a second electrode EL2, and a light emitting layer EML emits light according to an output signal of the driving thin film transistor TFT2 to display the image. A more detailed description of the first electrode EL1 and the second electrode EL2 is given below.

The capacitor Cst is connected between the second gate electrode GE2 and the second source electrode SE2 of the driving thin film transistor TFT2 and charges and maintains the data (e.g., the data signal) that is input to the second gate electrode GE2 of the driving thin film transistor TFT2. The capacitor Cst may include the first common electrode CE1, which is connected to the first drain electrode DE1 through a sixth contact opening CH6 (e.g., a sixth contact hole), and the second common electrode CE2, which is connected to the driving voltage lines DVL.

Referring to FIGS. 3B-3D, any suitable base substrate BS may be used and may include, for example, a plastic, an organic polymer, and/or the like. The organic polymer forming the base substrate BS may include (or may be) polyethylene terephthalate (PET), polyethylene naphthalate (PEN), polyimide, polyethersulfone, and/or the like. The base substrate BS may be selected in consideration of mechanical hardness, thermal stability, transparency, surface smoothness, ease of handling, waterproofness, and/or the like. The base substrate BS may be transparent.

A substrate buffer layer may be provided on the base substrate BS. The substrate buffer layer may prevent impurities from diffusing to the switching thin film transistor TFT1 and the driving thin film transistor TFT2. The substrate buffer layer may include (or may be formed of) silicon nitride ($SiN_x$), silicon oxide ($SiO_x$), silicon oxynitride ($Si$-$O_xN_y$), and/or the like but, in other embodiments, may be excluded according to the material and process conditions of the base substrate BS.

A first semiconductor pattern SM1 and a second semiconductor pattern SM2 may be provided on the base substrate BS. The first semiconductor pattern SM1 and the second semiconductor pattern SM2 are formed of a semiconductor material and respectively operate as an active layer for the switching thin film transistor TFT1 and for the driving thin film transistor TFT2. Each of the first semiconductor pattern SM1 and the second semiconductor pattern SM2 includes a source area SA, a drain area DRA, and a channel area CA disposed between the source area SA and the drain area DRA. Each of the first semiconductor pattern SM1 and the second semiconductor pattern SM2 may include (or may be formed of) an inorganic semiconductor and/or an organic semiconductor. The source area SA and the drain area DRA may be doped with an n-type impurity or a p-type impurity.

A gate insulating layer GI is provided on the first semiconductor pattern SM1 and the second semiconductor pattern SM2. The gate insulating layer GI covers the first semiconductor pattern SM1 and the second semiconductor pattern SM2. The gate insulating layer GI may include (or may be composed of) an organic insulating material and/or an inorganic insulating material.

The first gate electrode GE1 and the second gate electrode GE2 are provided on the gate insulating layer GI. The first gate electrode GE1 and the second gate electrode GE2 are formed so as to respectively cover a region corresponding to the first semiconductor pattern SM1 and the second semiconductor pattern SM2.

An insulating layer IL is provided on the first gate electrode GE1 and the second gate electrode GE2. The insulating layer IL covers the first gate electrode GE1 and the second gate electrode GE2. The insulating layer IL may include (or may be composed of) an organic insulating material and/or an inorganic insulating material.

The first source electrode SE1 and the first drain electrode DE1 and the second source electrode SE2 and the second drain electrode DE2 are provided on the insulating layer IL. The second drain electrode DE2 contacts the drain area DRA of the second semiconductor pattern SM2 through a first contact opening CH1 (e.g., a first contact hole) formed in the gate insulating layer GI and the insulating layer IL. The second source electrode SE2 contacts the source area SA of the second semiconductor pattern SM2 through a second contact opening CH2 (e.g., a second contact hole) formed in the gate insulating layer GI and the insulating layer IL. The first source electrode SE1 contacts the source area of the first semiconductor pattern through a fourth contact opening CH4 (e.g., a fourth contact hole) formed in the gate insulating layer GI and the insulating layer IL. The first drain electrode DE1 contacts the drain area of the first semiconductor pattern SM1 through the fifth contact opening CH5 formed in the gate insulating layer GI and the insulating layer IL.

A passivation layer PL is provided on the first source electrode SE1 and the first drain electrode DE1 and on the second source electrode SE2 and the second drain electrode DE2. The passivation layer PL may act as a protective film that protects the switching thin film transistor TFT1 and the driving thin film transistor TFT2 and may also act as a flattening film that flattens (e.g., planarizes) a top surface thereof.

The first electrode EL1 is provided on the passivation layer PL. The first electrode EL1 may be, for example, a positive electrode. The first electrode EL1 is connected to the second drain electrode DE2 of the driving thin film transistor TR2 through the third contact opening CH3 formed in the passivation layer PL.

The pixel defining film PDL, which partitions the light emitting layer EML so as to respectively correspond to the pixels PX, is provided on the passivation layer PL. The pixel defining film PDL exposes a top surface of the first electrode EL1 and protrudes above the base substrate BS. The pixel defining layer PDL may include a metal-fluoride compound, but embodiments of the present disclosure are not limited thereto. For example, the pixel defining film PDL may include (or may be composed of) a metal-fluoride compound, such as lithium fluoride (LiF), barium fluoride (BaF$_2$), and/or cesium fluoride (CsF). The metal-fluoride compound has an insulating property when formed to have a certain thickness (e.g., when formed to have a sufficient or predetermined thickness). The thickness of the pixel defining film PDL may be, for example, in a range of about 10 nm to about 100 nm. A more detailed description of the pixel defining film PDL is given below.

The organic light emitting element OEL is provided in a region surrounded by the pixel defining film PDL (e.g., is provided in an opening in the pixel defining film PDL). The organic light emitting element OEL includes the first electrode EL1, an organic layer OL, and the second electrode EL2. The organic layer OL includes a hole transport region HTR, a light emitting layer EML, and/or an electron transport region ETR.

The first electrode EL1 has a conductive property. The first electrode EL1 may be a pixel electrode (e.g., the positive electrode). The first electrode EL1 may be a transmissive electrode, a semi-transmissive electrode, or a reflective electrode. When the first electrode EL1 is a transmissive electrode, the first electrode EL1 may include (or may be composed of) a transparent metal oxide, for example, indium tin oxide (ITO), indium zinc oxide (IZO), zinc oxide (ZnO), indium tin zinc oxide (ITZO), and/or the like. When the first electrode EL1 is a semi-transmissive electrode or a reflective electrode, the first electrode EL1 may include aluminum (Al), copper (Cu), titanium (Ti), molybdenum (Mo), silver (Ag), magnesium (Mg), platinum (Pt), palladium (Pd), gold (Au), nickel (Ni), neodymium (Nd), iridium (Ir), and/or chrome (Cr).

The organic layer OL may be disposed on the first electrode EL1. The organic layer OL includes the light emitting layer EML. The organic layer OL may further include the hole transport region HTR and/or the electron transport region ETR.

The hole transport region HTR is provided on the first electrode EL1. The hole transport region HTR may include a hole injection layer, a hole transport layer, a buffer layer, and/or an electron blocking layer.

The hole transport region may be a single layer composed of a single material, may be a single layer including a plurality of different materials, or may have a multilayer structure including a plurality of layers, each of which include (or are composed of) different materials.

For example, the hole transport region HTR may have a structure in which single layers include (or are composed of) a plurality of materials which are different from each other or may have a structure in which the hole injection layer/the hole transport layer, the hole injection layer/the hole transport layer/the buffer layer, the hole injection layer/the buffer layer, the hole transport layer/the buffer layer, or the hole injection layer/the hole transport layer/the electron blocking layer are laminated (e.g., stacked) in order from the first electrode EL1, but embodiments of the present disclosure are not limited thereto.

The hole transport region HTR may be formed by using various suitable methods, such as a vacuum deposition method, a spin coating method, a casting method, a Langmuir-Blodgett method, an inkjet printing method, a laser printing method, a laser induced thermal imaging (LITI) method, or the like.

When the hole transport region HTR includes the hole injection layer, the hole transport region HTR may include a phthalocyanine compound, such as copper phthalocyanine, or may include n,n'-diphenyl-n,n'-bis-[4-(phenyl-m-tolylamino)-phenyl]-biphenyl-4,4'-diamine (DNTPD), 4,4',4''-tris(3-methylphenylphenylamino)triphenylamine (m-MTDATA), 4,4'4''-tris(n,n-diphenylamino)triphenylamine (TDATA), 4,4',4''-tris{n,-(2-naphthyl)-n-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid) (PANI/CSA), polyaniline)/poly(4-styrenesulfonate) (PANI/PSS), and/or the like, but embodiments of the present disclosure are not limited thereto.

When the hole transport region HTR includes the hole transport layer, the hole transport region HTR may include a carbazole-based derivative, such as n-phenylcarbazole or polyvinylcarbazole, a fluorene-based derivative, a triphenylamine-based derivative, such as n,n'-bis(3-methylphenyl)-n,n'-diphenyl-[1,1-biphenyl]-4,4'-diamine (TPD) or 4,4',4''-tris(n-carbazolyl)triphenylamine (TCTA); n,n'-di(1-naphthyl)-n,n'-diphenylbenzidine (NPB); 4,4'-cyclohexylidene bis[n,n-bis(4-methylphenyl)benzenamine] (TAPC), and/or the like, but the present disclosure is not limited thereto.

In addition to the above-described materials, the hole transport region HTR may further include a charge generating material for improving the conductive properties thereof. The charge generating material may be uniformly or non-uniformly dispersed in the hole transport region HTR. The charge generating material may be, for example, a p-dopant (a p-type dopant). The p-dopant may be a quinone derivative, a metal oxide, and/or a cyano group-containing compound, but the present disclosure is not limited thereto. For example, non-limiting examples of the p-dopant may include the quinone derivative, such as tetracyanoquinodimethane (TCNQ) or 2,3,5,6-tetrafluoro-tetracyanoquinodimethane (F4-TCNQ), and/or a metal oxide, such as tungsten oxide or molybdenum oxide, but the p-dopant is not limited thereto.

The light emitting layer EML is provided on the hole transport region HTR. The light emitting layer may be a single layer composed of a single material, may be a single layer including (or composed of) a plurality of materials that are different from each other, or may have a multilayer structure including a plurality of layers, each of which include (or are composed of) different materials.

Any suitable material may be used for the light emitting layer EML, and the light emitting layer EML may include (or may be made of) a material that emits, for example, a red colored light, a green colored light, or a blue colored light. The light emitting layer EML may include a fluorescent or phosphorescent material. Moreover, the light emitting layer EML may include a host and a dopant.

Any suitable material may be used for the host, for example, tris(8-hydroxyquinolino)aluminum (Alq3), 4,4'-bis(n-carbazolyl)-1,1-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(n-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), and/or the like may be used.

When the light emitting layer EML emits the red colored light, the light emitting layer EML may include the fluorescent material including, for example, tris(dibenzoylmethanato)phenanthroline europium (PBD:Eu(DBM)3(Phen)) and/or perylene. When the light emitting layer EML emits the red colored light, the dopant contained in the light emitting layer EML may be a metal complex or an organometallic complex, such as, for example, bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and/or octaethylporphyrin platinum (PtOEP).

When the light emitting layer EML emits the green colored light, the light emitting layer EML may include the fluorescent material including, for example, tris(8-hydroxyquinolino)aluminum (Alq3). When the light emitting layer EML emits the green colored light, the dopant contained in the light emitting layer EML may be a metal complex or an organometallic complex, such as, for example, fac-tris(2-phenylpyridine)iridium (Ir(ppy)3).

When the light emitting layer EML emits the blue colored light, the light emitting layer EML may include the fluorescent material including spiro-DPVBi, spiro-6P, distyryl-benzene (DSB), distyryl-arylene (DSA), a polyfluorene (PFO)-based polymer, and/or a poly(p-phenylene vinylene) (PPV)-based polymer. When the light emitting layer EML emits the blue colored light, the dopant contained in the light emitting layer EML may be a metal complex or an organometallic complex, such as, for example, (4,6-F2ppy)2Irpic. A more detailed description of the light emitting layer EML is given below.

The electron transport region ETR is provided on the light emitting layer EML. The electron transport region ETR may include a hole blocking layer, an electron transport layer, and/or an electron injection layer, but embodiments of the present disclosure are not limited thereto.

When the electron transport region ETR includes the electron transport layer, the electron transport region ETR may include tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate (Bebq2), 9,10-di(naphthalene-2-yl)anthracene (ADN), or compounds thereof, but embodiments of the present disclosure are not limited thereto. A thickness of the electron transport layers may be in a range of about 100 Å to about 1000 Å (about 10 nm to about 100 nm), for example, in a range of about 150 Å to about 500 Å (about 15 nm to about 50 nm). When the thickness of the electron transport layers is in the above-described range, a sufficient electron transporting property may be obtained without a substantial increase in the driving voltage.

When the electron transport region ETR includes the electron injection layer, lithium fluoride (LiF), lithium quinolate (LiQ), lithium oxide (Li$_2$O), barium oxide (BaO), sodium chloride (NaCl), cesium fluoride (CsF), a lanthanide, such as ytterbium (Yb), a metal halide, such as rubidium chloride (RbCl) or rubidium iodide (RbI), and/or the like may be included in (or may be used in) the electron transport region ETR, but the electron transport region ETR is not limited thereto. Moreover, the electron injection layer may include (or may be made of) a material in which the electron transport material is mixed with an insulating organo metal salt. The organo metal salt may be a material having an energy band gap of at least about 4 eV. In one embodiment, the organo metal salt may include, for example, a metal acetate, a metal benzoate, a metal acetoacetate, a metal acetylacetonate, and/or a metal stearate. A thickness of the electron injection layer may be in a range of about 1 Å to about 100 Å (about 0.1 nm to about 10 nm), for example, in a range of about 30 Å to about 90 Å (about 3 nm to about 9 nm). When the thickness of the electron injection layer is in the above range, a sufficient electron injecting property may be obtained without a substantial increase in the driving voltage.

As described above, the electron transport region may include the hole blocking layer. The hole blocking layer may include, for example, 2,9-dimethyl-4,7-diphenyl-1,10-phenanthroline (BCP) and/or 4,7-diphenyl-1,10-phenanthroline (Bphen), but embodiments of the present disclosure are not limited thereto.

The second electrode EL2 is provided on the electron transport region ETR. The second electrode EL2 may be the common electrode (e.g., the negative electrode).

The second electrode EL2 may be a transmissive electrode, a semi-transmissive electrode, or a reflective electrode. When the second electrode EL2 is a transmissive electrode, the second electrode EL2 may include lithium (Li), calcium (Ca), lithium fluoride/calcium (LiF/Ca), lithium fluoride/aluminum (LiF/Al), aluminum (Al), magnesium (Mg), barium fluoride (BaF), barium (Ba), silver (Ag), or compounds or mixtures thereof (e.g., a mixture of silver (Ag) and magnesium (Mg)).

The second electrode EL2 may include an auxiliary electrode. The auxiliary electrode may include a film that is formed through deposition such that the deposited material is on (or faces) the light emitting layer EML and may include a transparent metal oxide, for example, indium tin oxide (ITO), indium zinc oxide (IZO), zinc oxide (ZnO), indium tin zinc oxide (ITZO), molybdenum (Mo), titanium (Ti), and/or the like on the film.

When the second electrode EL2 is a semi-transmissive electrode, the second electrode EL2 may include silver (Ag), magnesium (Mg), copper (Cu), aluminum (Al), platinum (Pt), palladium (Pd), gold (Au), nickel (Ni), neodymium (Nd), iridium (Ir), chrome (Cr), lithium (Li), calcium (Ca), lithium fluoride/calcium (LiF/Ca), lithium fluoride/aluminum (LiF/Al), molybdenum (Mo), titanium (Ti), or compounds or mixtures thereof (e.g., a mixture of silver (Ag) and magnesium (Mg)). The second electrode EL2 may also be a multilayer structure including the reflective layer and/or the semi-transmissive layer including the above material(s) and/or the transparent conductive layer including (or formed of) indium tin oxide (ITO), indium zinc oxide (IZO), zinc oxide (ZnO), indium tin zinc oxide (ITZO), and/or the like.

When the organic light emitting element OEL is a front emission type, the first electrode EL1 may be a reflective electrode and the second electrode EL2 may be a transmissive electrode or a semi-transmissive electrode. When the organic light emitting element OEL is a rear emission type, the first electrode EL1 may be a transmissive electrode or a semi-transmissive electrode and the second electrode EL2 may be a reflective electrode.

In the organic light emitting element OEL, when a voltage is applied to each of the first electrode EL1 and the second electrode EL2, holes injected from the first electrode EL1 move to the light emitting layer EML by passing through the hole transport region HTR and electrons injected from the second electrode EL2 move to the light emitting layer EML by passing through the electron transport region ETR. The electrons and the holes are recombined in the light emitting layer EML to generate excitons, and light is emitted as the excitons fall from an excited state to a ground state.

Referring again to FIGS. 1 and 2, the polarizing member POL may be a flexible polarizing member. The polarizing member POL includes an absorption axis extending in a certain or particular direction. The polarizing member POL absorbs light which oscillates in a direction that is parallel to the direction in which the absorption axis extends from among light incident thereon.

The polarizing member POL includes a bending area PBF and non-bending areas PNBF1 and PNBF2. The bending area PBF is connected to (extends from) the non-bending areas PNBF1 and PNBF2. In one embodiment, the polarizing member POL may include a plurality of non-bending areas PNBF1 and PNBF2. In one embodiment, the polarizing member POL may include two non-bending areas PNBF1 and PNBF2. The non-bending areas PNBF1 and PNBF2 may include a first non-bending area PNBF1 connected to (extending from) an end of the bending area PBF and a second non-bending area PNBF2 connected to (extending from) the other end of the bending area PBF.

The bending area PBF is bent along the bending axis BX in the first mode, and the bending area PBF is unbent (e.g., is flat or substantially flat) in the second mode. In each of the first mode and the second mode, the non-bending areas PNBF1 and PNBF2 are not bent (e.g., are flat or substantially flat). In each of the first mode and the second mode, the non-bending areas PNBF1 and PNBF2 may be flat or slightly bent. In FIG. 1, a distance between the first non-bending area PNBF1 and the second non-bending area PNBF2 is illustrated as being constant with respect to the bending axis BX, but embodiments of the present disclosure are not limited thereto. For example, the distance between the first non-bending area PNBF1 and the second non-bending area PNBF2, which are bent to face each other, may vary. Moreover, in FIG. 1, surface areas of the first non-bending area PNBF1 and the second non-bending area PNBF2, which are bent to face each other, are illustrated as being the same as each other when the polarizing member POL is bent along the bending axis BX, but embodiments of the present disclosure are not limited thereto. For example, the surface areas of the first non-bending area PNBF1 and the second non-bending area PNBF2, which are bent to face each other, may be different from each other.

The window WD may be a flexible window. The window WD protects the display panel DP and/or other components. Any suitable window known in the technical field may be employed as the window WD. For example, a flexible plastic window may be used. However, the window WD is not limited thereto and may include a structure in which a flexible polymer layer is provided on a surface of a glass substrate.

The window WD includes a bending area WBF and non-bending areas WNBF1 and WNBF2. The bending area WBF is connected to (extends from) the non-bending areas WNBF1 and WNBF2. In one embodiment, the window WD may include a plurality of non-bending areas WNBF1 and WNBF2. For example, in one embodiment, the window WD may include two non-bending areas WNBF1 and WNBF2. The non-bending areas WNBF1 and WNBF2 may include a first non-bending area WNBF1 connected to (extending from) an end of the bending area WBF and a second non-bending area WNBF2 connected to (extending from) the other end of the bending area WBF.

The bending area WBF is bent along the bending axis BX in the first mode, and the bending area WBF is unbent (e.g., is flat or substantially flat) in the second mode. In each of the first mode and the second mode, the non-bending areas WNBF1 and WNBF2 are not bent (e.g., are flat or substantially flat). In each of the first mode and the second mode, the non-bending areas WNBF1 and WNBF2 may be flat or slightly bent. In FIG. 1, a distance between the first non-bending area WNBF1 and the second non-bending area WNBF2 is illustrated as being constant with respect to the bending axis BX, but embodiments of the present disclosure are not limited thereto. For example, the distance between the first non-bending area WNBF1 and the second non-bending area WNBF2, which are bent to face each other, may vary. Moreover, in FIG. 1, surface areas of the first non-bending area WNBF1 and the second non-bending area WNBF2, which are bent to face each other, are illustrated as being the same as each other when the window WD is bent along the bending axis BX, but embodiments of the present disclosure are not limited thereto. For example, the surface areas of the first non-bending area WNBF1 and the second non-bending area WNBF2, which are bent to face each other, may be different from each other.

The first adhesive member AD1 includes a bending area ABF and non-bending areas ANBF1 and ANBF2. The bending area ABF is connected to (extends from) the non-bending areas ANBF1 and ANBF2. In one embodiment, the first adhesive member AD1 may include a plurality of non-bending areas ANBF1 and ANBF2. For example, in one embodiment, the first adhesive member AD1 may include two non-bending areas ANBF1 and ANBF2. The non-bending areas ANBF1 and ANBF2 may include a first non-bending area ANBF1 connected to (extending from) an end of the bending area ABF and a second non-bending area ANBF2 connected to (extending from) the other end of the bending area ABF.

The bending area ABF is bent along the bending axis BX in the first mode, and the bending area ABF is unbent (e.g., is flat or substantially flat) in the second mode. In each of the first mode and the second mode, the non-bending areas ANBF1 and ANBF2 are not bent (e.g., are flat or substantially flat). In each of the first mode and the second mode, the non-bending areas ANBF1 and ANBF2 may be flat or slightly bent. In FIG. 1, a distance between the first non-bending area ANBF1 and the second non-bending area ANBF2 is illustrated as being constant with respect to the bending axis BX, but embodiments of the present disclosure are not limited thereto. For example, the distance between the first non-bending area ANBF1 and the second non-bending area ANBF2, which are bent to face each other, may vary. Moreover, in FIG. 1, surface areas of the first non-bending area ANBF1 and the second non-bending area ANBF2, which are bent to face each other, are illustrated as being the same as each other when the first adhesive member AD1 is bent along the bending axis BX, but embodiments of the present disclosure are not limited thereto. For example, the surface areas of the first non-bending area ANBF1 and the second non-bending area ANBF2, which are bent to face each other, may be different from each other.

The second adhesive member AD2 includes a bending area MBF and non-bending areas MNBF1 and MNBF2. The bending area MBF is connected to (extends from) the non-bending areas MNBF1 and MNBF2. In one embodiment, the second adhesive member AD2 may include a plurality of non-bending areas MNBF1 and MNBF2. For example, in one embodiment, the second adhesive member AD2 may include two non-bending areas MNBF1 and MNBF2. The non-bending areas MNBF1 and MNBF2 may include a first non-bending area MNBF1 connected to (extending from) an end of the bending area MBF and a second non-bending area MNBF2 connected to (extending from) the other end of the bending area MBF.

The bending area MBF is bent along the bending axis BX in the first mode, and the bending area MBF is unbent (e.g., is flat or substantially flat) in the second mode. In each of the first mode and the second mode, the non-bending areas MNBF1 and MNBF2 are not bent (e.g., are flat or substantially flat). In each of the first mode and the second mode, the non-bending areas MNBF1 and MNBF2 may be flat or slightly bent. In FIG. 1, a distance between the first non-bending area MNBF1 and the second non-bending area MNBF2 is illustrated as being constant with respect to the bending axis BX, but embodiments of the present disclosure are not limited thereto. For example, the distance between the first non-bending area MNBF1 and the second non-bending area MNBF2, which are bent to face each other, may vary. Moreover, in FIG. 1, surface areas of the first non-bending area MNBF1 and the second non-bending area MNBF2, which are bent to face each other, are illustrated as being the same as each other when the second adhesive member AD2 is bent along the bending axis BX, but embodiments of the present disclosure are not limited thereto. For example, the surface areas of the first non-bending area MNBF1 and the second non-bending area MNBF2, which are bent to face each other, may be different from each other.

The bending area ABF of the first adhesive member AD1 is provided on the bending area DBF of the display panel DP. The bending area PBF of the polarizing member POL is provided on the bending area ABF of the first adhesive member AD1. The bending area MBF of the second adhesive member AD2 is provided on the bending area PBF of the polarizing member POL. The bending area WBF of the window WD is provided on the bending area MBF of the second adhesive member AD2.

The non-bending areas ANBF1 and ANBF2 of the first adhesive member are provided on the non-bending areas DNBF1 and DNBF2 of the display panel DP. The non-bending areas PNBF1 and PNBF2 of the polarizing member POL are provided on the non-bending areas ANBF1 and ANBF2 of the first adhesive member. The non-bending areas MNBF1 and MNBF2 of the second adhesive member AD2 are provided on the non-bending areas PNBF1 and PNBF2 of the polarizing member POL. The non-bending areas WNBF1 and WNBF2 of the window WD are provided on the non-bending areas MNBF1 and MNBF2 of the second adhesive member AD2.

Each of the first adhesive member AD1 and the second adhesive member AD2 has a storage modulus in a range of about $5 \times 10^4$ Pa to about $5 \times 10^5$ Pa at about $-25°$ C. When the storage modulus for each of the first adhesive member AD1 and the second adhesive member AD2 is in the above range, each of the first adhesive member AD1 and the second adhesive member AD2 may exhibit sufficient adhesiveness and may be easily bent into the first mode by an external force.

Typically, the storage modulus of an adhesive member decreases as a temperature increases (e.g., when going from a lower temperature to a higher temperature), and the smaller the storage modulus, the greater the sensitivity to the external environment (e.g., to the temperature and/or humidity). The adhesive member that is adjacent to the bending axis BX is subjected to greater stress in the first mode than elements which are further away from the bending axis. For example, the adhesive member adjacent to (e.g., nearer to) the bending axis BX is subjected to greater forces (e.g., is placed in a more severe environment) compared to elements which are further away from the bending axis BX. Furthermore, micro-bubbles may be generated in (e.g., may be easily generated in) the adhesive member due to a reduced storage modulus experienced at relatively high temperatures. The micro-bubbles cause peeling or the like of the adhesive member.

The foldable display device 10 according to an embodiment of the present disclosure may suppress the generation of the micro-bubbles under relatively high temperature and/or humidity conditions by controlling (or setting or selecting) the high temperature storage modulus of the second adhesive member AD2, which is the adhesive member adjacent to (e.g., nearest to) the bending axis BX. For example, the second adhesive member AD2 has a storage modulus in a range of about $4.5 \times 10^4$ Pa to about $6.5 \times 10^4$ Pa at about $60°$ C. When the storage modulus of the second adhesive member AD2 at about $60°$ C. is less than about $4.5 \times 10^4$ Pa, the micro-bubble suppressing effect may not be present (e.g., may not be exhibited). When the storage modulus is greater than about $6.5 \times 10^4$ Pa, the adhesiveness of the second adhesive member AD2 may be reduced and the second adhesive member AD2 may not be easily bent due to an external force to enter the first mode.

In the present specification, the storage modulus may be obtained or measured by reading a measured storage modulus value at a certain temperature (e.g., at $-20°$ C. or $60°$ C.) by using a rheometer at a frequency condition of about 1 Hz while increasing the temperature at a rate of about $3°$ C. per minute in a range of about $-30°$ C. to about $100°$ C.

The first adhesive member AD1 has a stress-relaxation ratio of greater than about 40 and less than about 50. The stress-relaxation ratio is defined by Formula 1:

$$\text{Stress-relaxation ratio (\%)} = 100 \times G(t2)/G(t1) \quad \text{[Formula 1]}$$

In Formula 1, G(t1) is an initial stress-relaxation modulus which is measured in a state in which the first adhesive member AD1 is about 600 μm thick. The initial stress-relaxation modulus may be measured with a rheometer in a stress-relaxation test mode when a strain of about 25% is removed from the first adhesive member AD1 after being applied and maintained thereto by using a parallel plate for about 100 seconds at about 60° C. G(t2) is a stress-relaxation modulus which is measured after the strain has been applied to (e.g., maintained in) the first adhesive member for about 300 seconds.

The stress-relaxation rate is an indicator of how easily deformation occurs due to an external force in the first mode (e.g., is bent to enter the first mode). When the stress-relaxation ratio of the first adhesive member AD1 is about 50 or greater, sufficient stress relaxation is not present with respect to the external force in the first mode, and thus, interlayer peeling may occur in the first mode (e.g., in the bent state). When the stress relaxation of the first adhesive member AD1 is about 40 or less, sufficient stress relaxation is present with respect to the external force in the first mode, but due to a deficient elastic recovery rate, which is the strain recovered when the first adhesive member is unbent from the first mode into the second mode, interlayer peeling may occur while the first adhesive member AD1 is unbent.

By adjusting the storage modulus of the second adhesive member AD2 to be relatively high, the shear strain applied to the display device as it is bent may increase. By adjusting the stress-relaxation ratio of the first adhesive member AD1 at a relatively high temperature to be relatively low, an increase in the shear stress may be offset. Thus, in the foldable display device 10 according to an embodiment of the present disclosure, the reliability and durability thereof under relatively high temperature and/or high moisture conditions may be improved by adjusting the stress-relaxation ratio of the first adhesive member AD1 and the storage modulus of the second adhesive member AD2 at relatively high temperatures.

The first adhesive member AD1 may have residual strain in a range of about 5 to about 8 at about 60° C. The residual strain may be defined by Formula 2:

$$\text{Residual strain (\%)} = L2/L1 \times 100 \quad \text{[Formula 2]}$$

In Formula 2, L1 is a maximum creep strain in a state in which the first adhesive member AD1 about 600 μm thick and a stress of about 2000 Pa (e.g., a maximum strain) is applied to the first adhesive member AD1 for about 1 hour at about 60° C. by using a rheometer. L2 is an unrecovered residual recovery strain which remains along with elastic recovery strain that is recovered when the applied stress is removed from the first adhesive member AD1 after achieving the maximum creep strain.

The residual strain is an indicator of how easily the bending area is unbent into the second mode. A lower residual strain indicates easier recovery into the second state (e.g., to the original state). When the residual strain of the first adhesive member AD1 is in the above range, interlayer peeling may be reduced or prevented when the first adhesive member AD1 is unbent after being in the bent state at relative high temperature and/or high humidity conditions for an extended period of time.

Figure 4A:
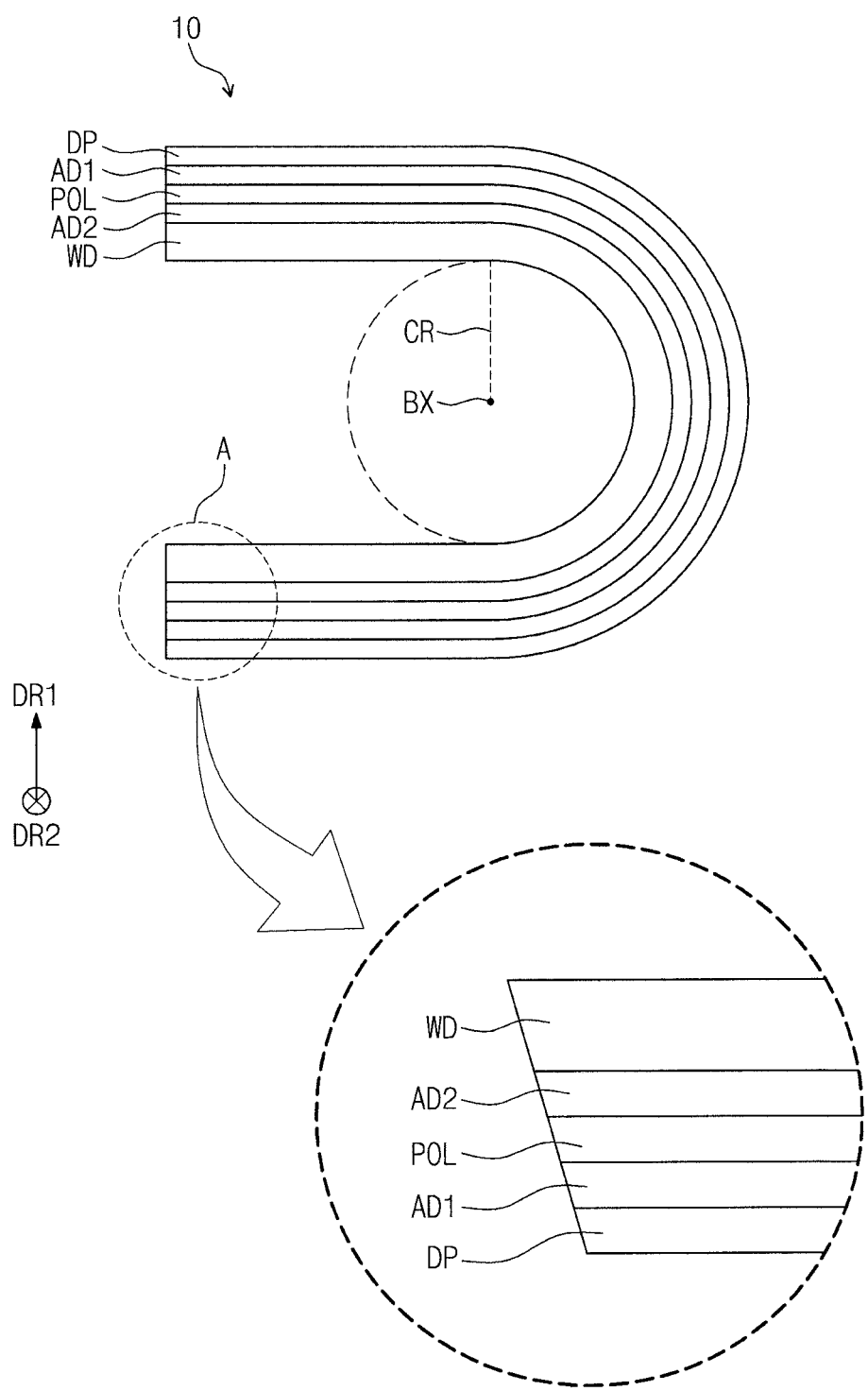
FIG. 4A is a schematic cross-sectional view of a foldable display device in a bent state according to an embodiment of the present disclosure.
Figure 4B:
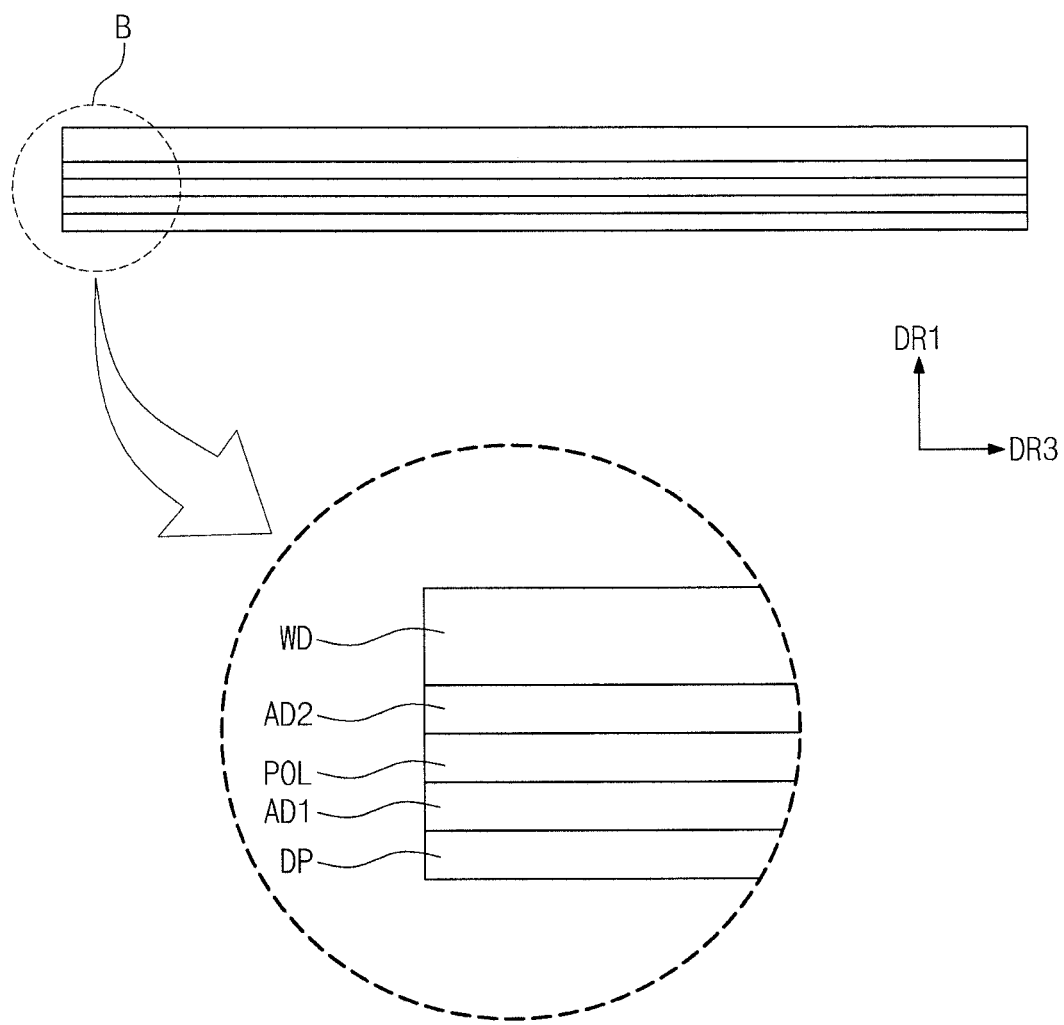
FIG. 4B is a schematic cross-sectional view of a foldable display device in an unbent state according to an embodiment of the present disclosure.
Figure 4C:
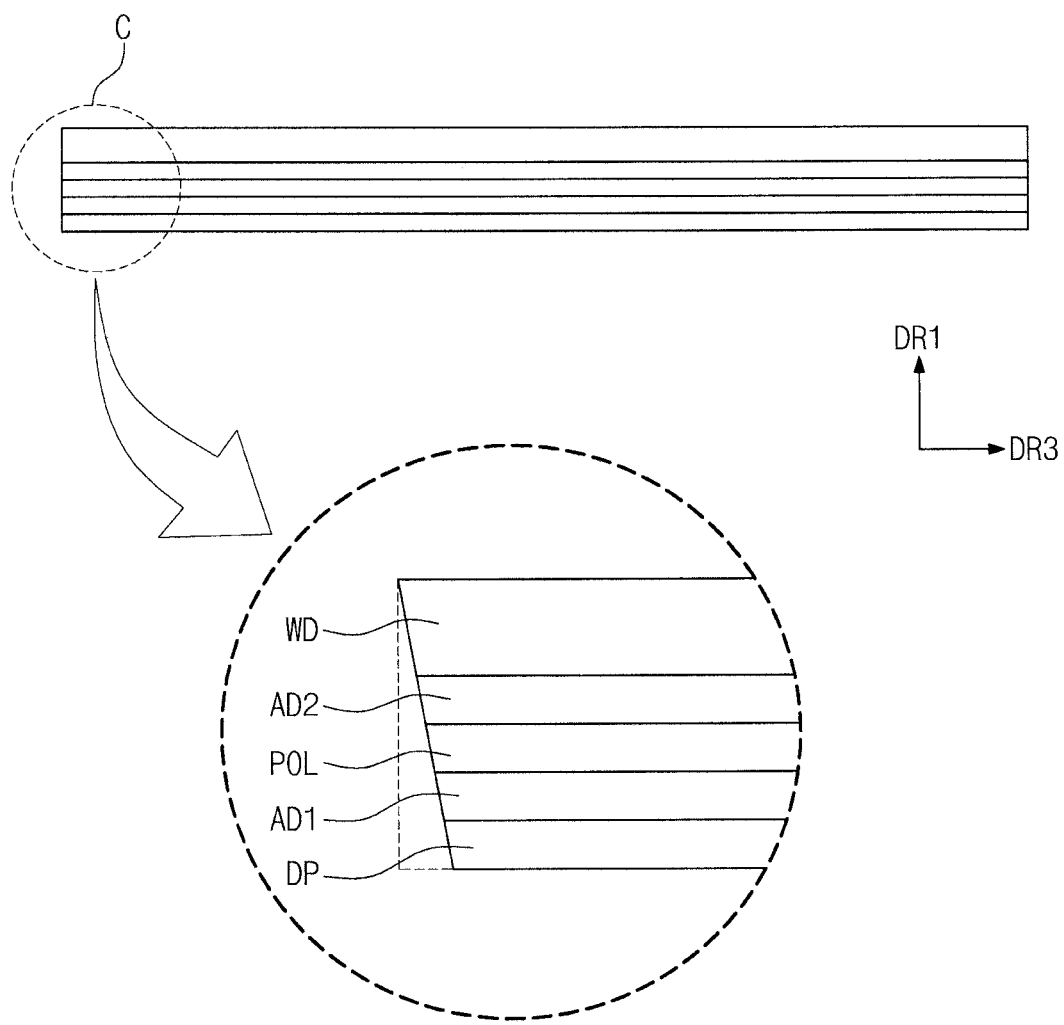
FIG. 4C is a drawing illustrating limitations when residual strain of a foldable display device is relatively high.

FIG. 4A is a schematic cross-sectional view of a foldable display device in a bent state according to an embodiment of the present disclosure. FIG. 4B is a schematic cross-sectional view of a foldable display device in an unbent state according to an embodiment of the present disclosure. FIG. 4C is a drawing illustrating limitations when residual strain of a foldable display device is relatively high.

Referring to FIG. 4A, because the display panel DP, the first adhesive member AD1, the polarizing member POL, the second adhesive member AD2, and the window WD have the same or substantially the same length, each end of the foldable display device 10 when bent (e.g., in the first mode) has an inclined shape (see A in FIG. 4A) when viewed in a cross-section.

Referring to FIGS. 4B and 4C, when the residual strain is relatively high and when the bending area is unbent into the second mode, each of the ends of the foldable display device 10 has an inclined shape (see C in FIG. 4C) as illustrated in FIG. 4C, unlike in FIG. 4B in which all of the elements are illustrated as being unbent to have the same length (expanded view of B in FIG. 4B). Consequently, interlayer peeling may occur.

The first adhesive member AD1 may be a double-sided adhesive. The first adhesive member AD1 may be a pressure-sensitive adhesive PSA. The first adhesive member AD1 may be flexible.

The second adhesive member AD2 may be a double-sided adhesive. The second adhesive member AD2 may be a pressure-sensitive adhesive PSA. The second adhesive member AD2 may be flexible.

The first adhesive member AD1 may have a thickness in a range of about 25 μm to about 100 μm. In one embodiment, the first adhesive member AD1 may have a thickness in a range of about 30 μm to about 70 μm. When the thickness of the first adhesive member AD1 is at least about 25 μm, the first adhesive member AD1 may withstand a force applied thereto when the bending area is unbent into the second mode, and when the thickness of the first adhesive member AD1 is at most about 100 μm, the display device may not be excessively thick.

The second adhesive member AD2 may have a thickness in a range of about 25 μm to about 100 μm. In one embodiment, the second adhesive member AD2 may have a thickness in a range of about 30 μm to about 70 μm. When the thickness of the second adhesive member AD2 is less than about 25 μm, the second adhesive member AD2 may be easily stretched such that the storage modulus of the second adhesive member AD2 may change. When the thickness of the second adhesive member AD2 exceeds about 100 μm, the stress applied thereto when bending into the first mode increases such that peeling may occur.

The first adhesive member AD1 may have a peel strength of at least about 800 gf/in (308.9 N/m). In one embodiment, the first adhesive member AD1 may have a peel strength in a range of about 800 gf/in (308.9 N/m) to about 1500 gf/in (579.1 N/m). The first adhesive member AD1 may have a peel strength of at least about 800 gf/in with a glass substrate.

The second adhesive member AD2 may have a peel strength of at least about 800 gf/in. In one embodiment, the second adhesive member AD2 may have a peel strength in a range of about 800 gf/in to about 1500 gf/in. The second adhesive member AD2 may have a peel strength of at least about 800 gf/in with a glass substrate.

When each of the first adhesive member AD1 and the second adhesive member AD2 is in the above range, the first and second adhesive members AD1 and AD2 may remain adhesive (e.g., may have satisfactory adhesiveness) for a relatively long period of time.

The peel strength of an adhesive member is a value measured by using a texture analyzer when a 180 degree peel is performed at a rate of about 300 mm/min after attaching the adhesive member to a glass substrate and leaving the adhesive member attached thereto at room temperature for about 20 minutes.

Each of the first adhesive member AD1 and the second adhesive member AD2 may include a base polymer including an acrylic-based polymer, a silicone-based polymer, polyester, polyurethane, polyamide, polyvinyl ether, a vinyl acetate/vinyl chloride copolymer, and/or an epoxy-modified polyolefin. However, the first adhesive member AD1 and the second adhesive member AD2 are not limited thereto.

The first adhesive member AD1 and the second adhesive member AD2 may further include an additive, such as a cross-linking agent or an adhesion imparting agent, in addition to the base polymer. The additive may be used alone or a plurality of additives may be used in combination.

For example, the first adhesive member AD1 may include a first silicone-based base polymer, a first adhesion imparting agent, and a first cross-linking agent. The second adhesive member AD2 may include a second silicone-based base polymer, a second adhesion-imparting agent, and a second cross-linking agent. The first silicone-based base polymer and the second silicone-based base polymer may be the same or may be different from each other. The first adhesion imparting agent and the second adhesion imparting agent may be the same or may be different from each other. The first cross-linking agent and the second cross-linking agent may be the same or may be different from each other.

A suitable cross-linking agent which is known in the technical field may be employed for each of the first cross-linking agent and the second cross-linking agent. Each of the first cross-linking agent and the second cross-linking agent may be an organopolysiloxane that includes a unit represented by $CH_3$—Si—H. About 1 to about 5 parts by weight of the first cross-linking agent may be included with respect to a total of 100 parts by weight of the first silicone-based base polymer and the first adhesion imparting agent of the first adhesive member AD1. When the content of the first cross-linking agent is less than about 1 part by weight, the physical properties of the first adhesive member AD1 may be degraded and migration of unreacted components may be reduced. When the content of the first cross-linking agent exceeds about 5 parts by weight, a hardness of the first adhesive member AD1 may increase and a stress relaxing characteristic thereof may be reduced. About 1 to about 5 parts of the second cross-linking agent may be included with respect to a total of 100 parts by weight of the second silicone-based base polymer and the second adhesion imparting agent. When the content of the second cross-linking agent is less than about 1 part by weight, the physical properties of the second adhesive member AD2 may be degraded and migration of unreacted components may be reduced. When the content of the second cross-linking agent exceeds about 5 parts by weight, a hardness of the second adhesive member AD2 may increase and a stress relaxing characteristic thereof may be reduced. Each of the first cross-linking agent and the second cross-linking agent may be used alone or a plurality of cross-linking agents may be used in combination.

A suitable adhesion imparting agent which is known in the technical field may be employed for each of the first adhesion imparting member and the second adhesion imparting member. Each of the first adhesion imparting agent and the second adhesion imparting agent may be an organopolysiloxane having an alkenyl group, a hydroxy group, and/or a methyl group on a molecular side chain. The average molecular weight for each of the first adhesion imparting agent and the second adhesion imparting agent is, in one embodiment, in a range of about 500 to about 1500. Each of the first adhesion imparting agent and the second adhesion imparting agent may be used alone or a plurality of adhesion imparting agents may be used in combination.

Materials which are different from each other may be used for the first adhesive member AD1 and the second adhesive member AD2 to realize the respectively above-described range of storage modulus values, or identical materials may be used by adjusting the weight fractions of each element or material therein to realize the above-described range of storage modulus values. For example, the storage modulus may be adjusted by suitably modifying the ratio of the adhesion imparting agent to the silicone-based base polymer. Typically, the storage modulus tends to increase as the ratio of the adhesion imparting agent to the silicone-based base polymer decreases.

In the first adhesive member AD1, the above-described stress-relaxation ratio value may be realized by adjusting, for example, the ratio of the adhesion imparting agent to the cross-linking agent in the adhesive member.

For example, the first adhesive member AD1 may contain about 60 wt % to about 90 wt % of the first silicone-based base polymer, about 10 wt % to about 40 wt % of the first adhesion imparting agent, and about 1 wt % to about 5 wt % of the first cross-linking agent. The second adhesive member AD2 may contain about 60 wt % to about 90 wt % of the second silicone-based base polymer, about 10 wt % to about 40 wt % of the second adhesion imparting agent, and about 1 wt % to about 5 wt % of the second cross-linking agent. While in the above ranges, the ratio of the first silicone-based base polymer:the first adhesion imparting agent:the first cross-linking agent may be different from the ratio of the second silicone-based base polymer:the second adhesion imparting agent:the second cross-linking agent.

Figure 5A:
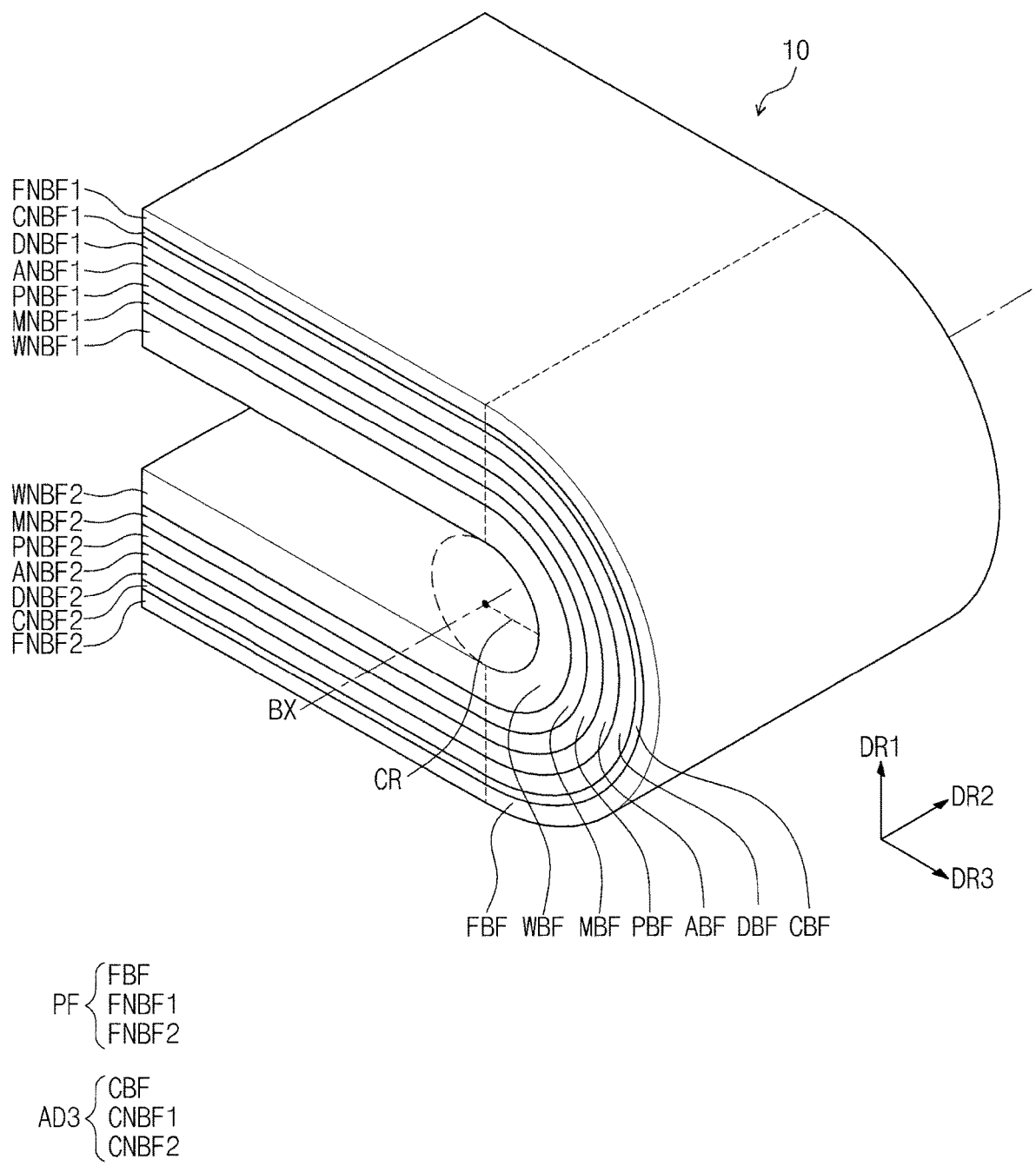
FIG. 5A is a schematic perspective view of a foldable display device in a bent state according to an embodiment of the present disclosure.
Figure 5B:
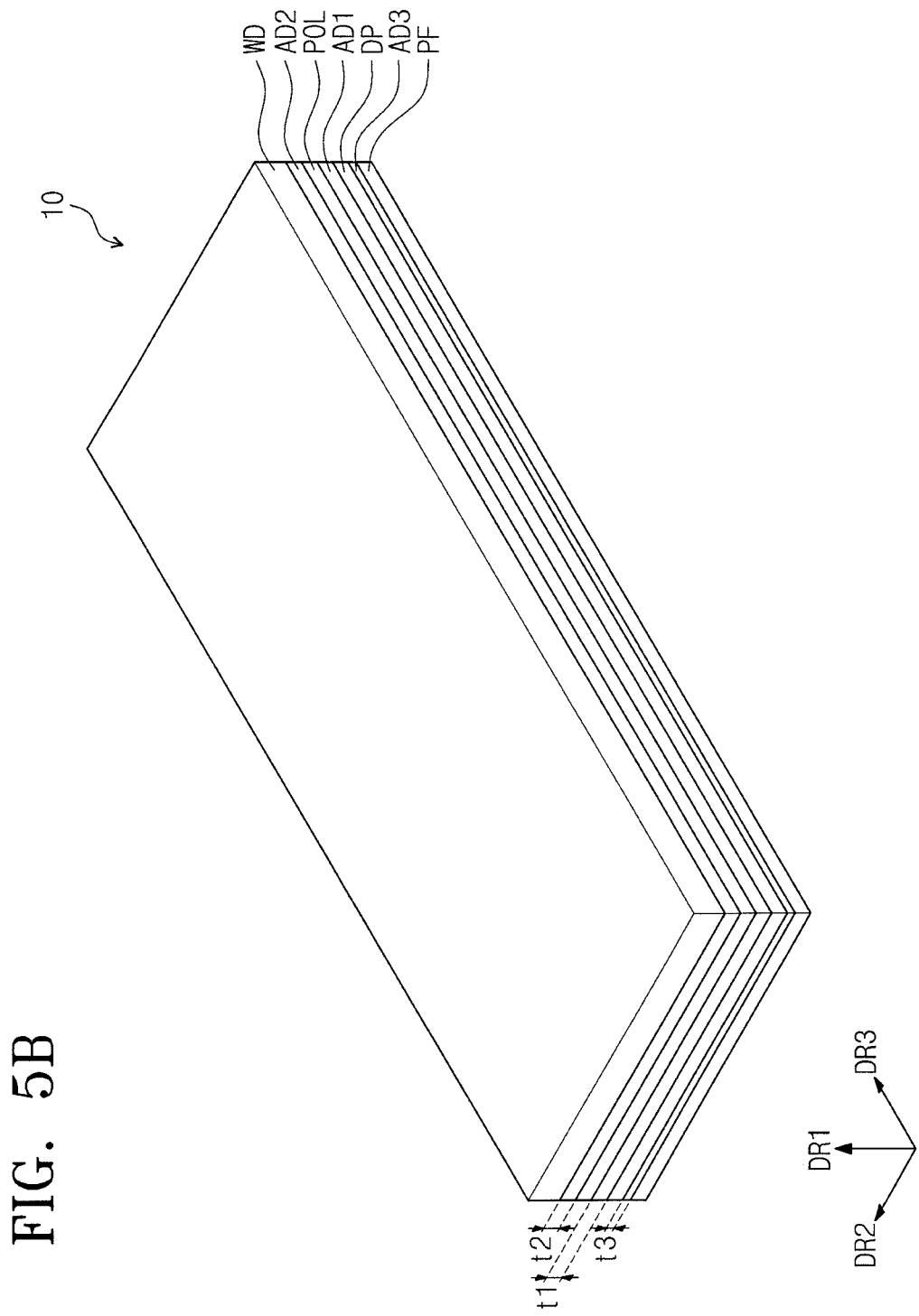
FIG. 5B is a schematic perspective view of a foldable display device in an unbent state according to an embodiment of the present disclosure.

FIG. 5A is a schematic perspective view of a foldable display device in a bent state according to an embodiment of the present disclosure. FIG. 5B is a schematic perspective view of a foldable display device in an unbent state according to an embodiment of the present disclosure.

Referring to FIGS. 1, 5A, and 5B, the foldable display device 10 according to an embodiment of the present disclosure may further include a third adhesive member AD3 and a protective film PF. The protective film PF and the third adhesive member AD3 are bent along the bending axis BX in the first mode along with the display panel DP, the first adhesive member AD1, the polarizing member POL, the second adhesive member AD2, and the window member WD, and are unbent (e.g., are flat or substantially flat) in the second mode.

The protective film PF is disposed below or under the display panel DP. The protective film PF protects the display panel DP from an external impact. A suitable protective film PF which is known in the technical field may be employed. For example, the protective film PF may be a polyimide film. For example, the protective film PF may be flexible.

The protective film PF includes a bending area FBF and non-bending areas FNBF1 and FNBF2. The bending area FBF is connected to (extends from) the non-bending areas FNBF1 and FNBF2. The protective film PF may include a plurality of non-bending areas FNBF1 and FNBF2. In one embodiment, the protective film PF may include two non-bending areas FNBF1 and FNBF2. The non-bending areas FNBF1 and FNBF2 may include a first non-bending area FNBF1 connected to (extending from) an end of the bending area FBF and a second non-bending area FNBF2 connected to (extending from) the other end of the bending area FBF.

The bending area FBF is bent along the bending axis BX in the first mode, and the bending area FBF is unbent (e.g., is flat or substantially flat) in the second mode. In each of the first mode and the second mode, the non-bending areas FNBF1 and FNBF2 are not bent (e.g., are flat or substantially flat). In each of the first mode and the second mode, the non-bending areas FNBF1 and FNBF2 may be flat or slightly bent. In FIG. 5A, a distance between the first non-bending area FNBF1 and the second non-bending area FNBF2 is illustrated as being constant with respect to the bending axis BX, but embodiments of the present disclosure are not limited thereto. For example, the distance between the first non-bending area FNBF1 and the second non-bending area FNBF2, which are bent to face each other, may vary. Moreover, in FIG. 5A, surface areas of the first non-bending area FNBF1 and the second non-bending area FNBF2, which are bent to face each other, are illustrated as being the same as each other when the protective film PF is bent along the bending axis BX, but embodiments of the present disclosure are not limited thereto. For example, the surface areas of the first non-bending area FNBF1 and the second non-bending area FNBF2, which are bent to face each other, may be different from each other.

The bending area FBF of the protective film PF is provided below the bending area DBF of the display panel DP. The non-bending areas FNBF1 and FNBF2 of the protective film PF are provided below the non-bending areas DNBF1 and DNBF2 of the display panel DP.

The third adhesive member AD3 may be disposed between the display panel DP and the protective film PF. The third adhesive member AD3 may be a double-sided adhesive. The third adhesive member AD3 may be a pressure-sensitive adhesive PSA. The third adhesive member AD3 may be flexible.

The third adhesive member AD3 includes a bending area CBF and non-bending areas CNBF1 and CNBF2. The bending area CBF is connected to (extends from) the non-bending areas CNBF1 and CNBF2. The third adhesive member AD3 may include a plurality of non-bending areas CNBF1 and CNBF2. In one embodiment, the third adhesive member AD3 may include two non-bending areas CNBF1 and CNBF2. The non-bending areas CNBF1 and CNBF2 may include a first non-bending area CNBF1 connected to (extending from) an end of the bending area CBF and a second non-bending area CNBF2 connected to (extending from) the other end of the bending area CBF.

The bending area CBF is bent along the bending axis BX in the first mode, and the bending area CBF is unbent (e.g., is flat or substantially flat) in the second mode. In each of the first mode and the second mode, the non-bending areas CNBF1 and CNBF2 are not bent (e.g., are flat or substantially flat). In each of the first mode and the second mode, the non-bending areas CNBF1 and CNBF2 may be flat or slightly bent. In FIG. 5A, a distance between the first non-bending area CNBF1 and the second non-bending area CNBF2 is illustrated as being constant with respect to the bending axis BX, but embodiments of the present disclosure are not limited thereto. For example, the distance between the first non-bending area CNBF1 and the second non-bending area CNBF2, which are bent to face each other, may vary. Moreover, in FIG. 5A, surface areas of the first non-bending area CNBF1 and the second non-bending area CNBF2, which are bent to face each other, are illustrated as being the same as each other when the third adhesive member AD3 is bent along the bending axis BX, but embodiments of the present disclosure are not limited thereto. For example, the surface areas of the first non-bending area CNBF1 and the second non-bending area CNBF2, which are bent to face each other, may be different from each other.

The bending area CBF of the third adhesive member AD3 is provided below the bending area DBF of the display panel and is provided on the bending area FBF of the protective film PF. The non-bending areas CNBF1 and CNBF2 of the third adhesive member AD3 are provided below the non-bending areas DNBF1 and DNBF2 of the display panel DP and are provided on the non-bending areas FNBF1 and FNBF2 of the protective film PF.

A thickness t3 of the third adhesive member AD3 may be less than a thickness t1 of the first adhesive member AD1. The thickness t3 of the third adhesive member AD3 may be less than a thickness t2 of the second adhesive member AD2. For example, the third adhesive member AD3 may have a thickness of at least about 10 µm and less than about 25 µm, but embodiments of the present disclosure are not limited thereto.

The third adhesive member AD3 may have a storage modulus in a range of about $5 \times 10^4$ Pa to about $5 \times 10^5$ Pa at about −25° C. When the storage modulus for the third adhesive member AD3 is in the above range at about −25° C., the third adhesive member AD3 may exhibit satisfactory adhesiveness while being easily bent into the first mode by an external force.

Figure 6A:
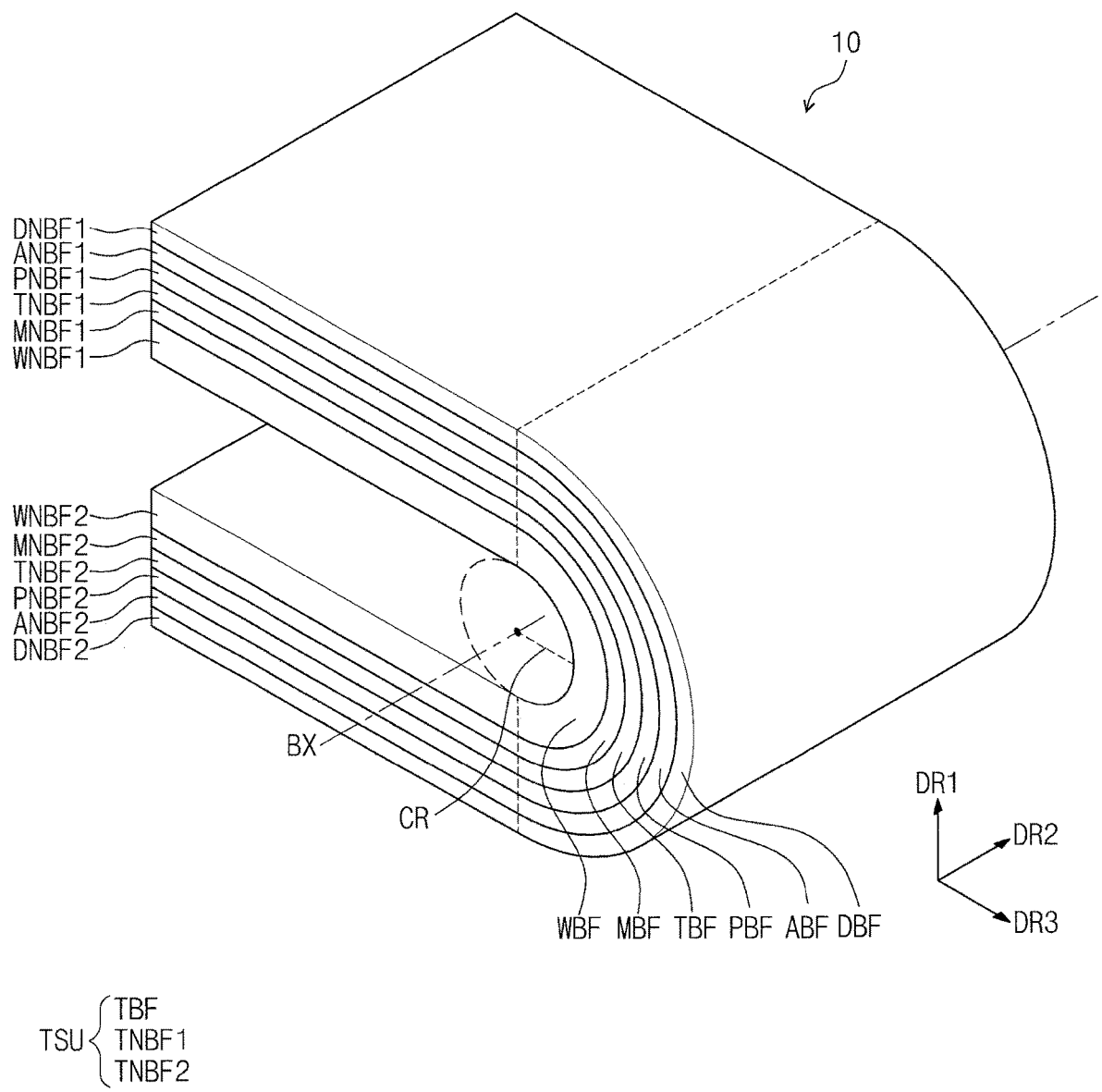
FIG. 6A is a schematic perspective view of a foldable display device in a bent state according to an embodiment of the present disclosure.
Figure 6B:
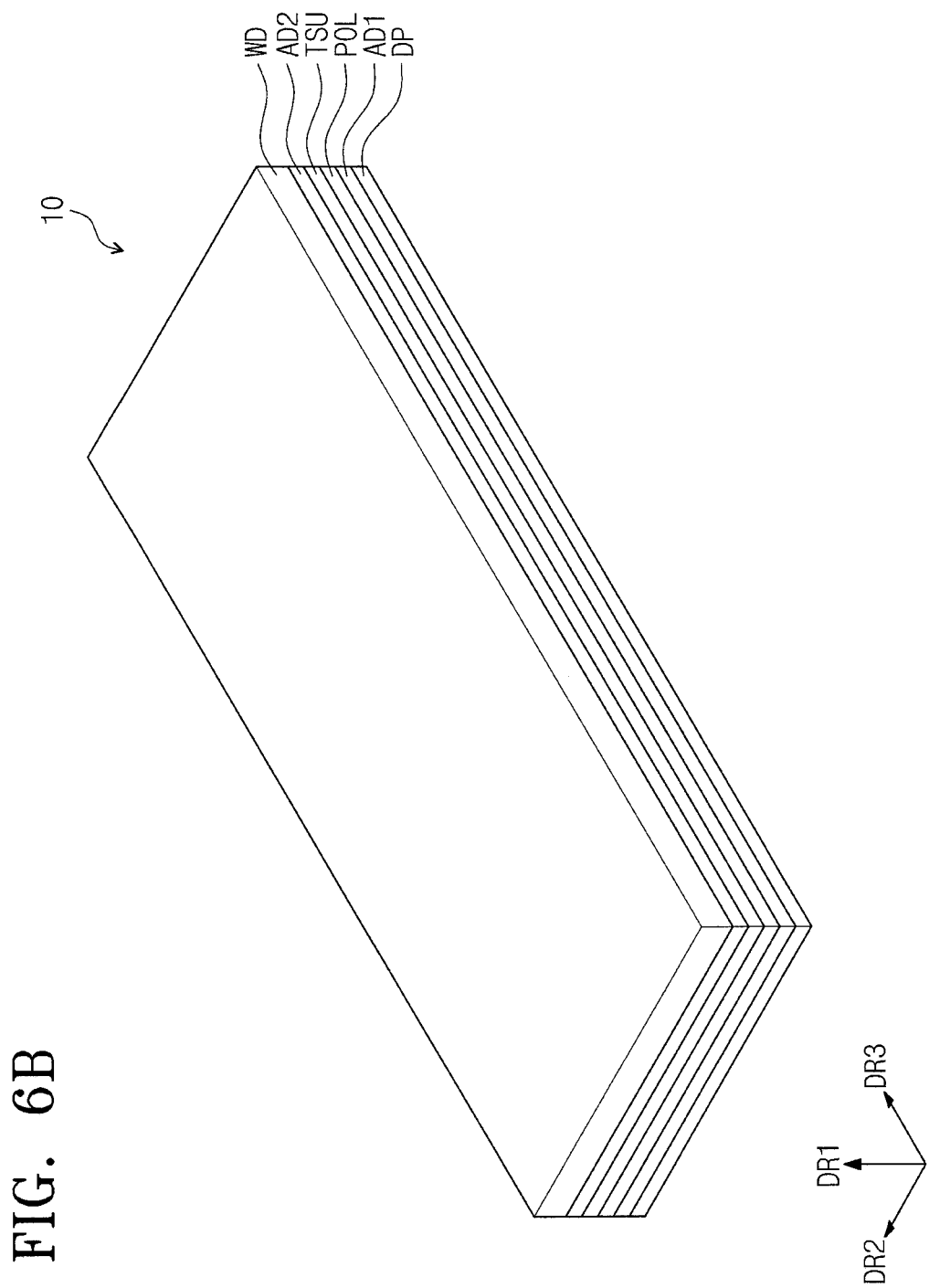
FIG. 6B is a schematic perspective view of a foldable display device in an unbent state according to an embodiment of the present disclosure.

FIG. 6A is a schematic perspective view of a foldable display device in a bent state according to an embodiment of the present disclosure. FIG. 6B is a schematic perspective view of a foldable display device in an unbent state according to an embodiment of the present disclosure.

Referring to FIGS. 1, 6A, and 6B, the foldable display device 10 according to an embodiment of the present disclosure may further include a touch sensing unit TSU (e.g., a touch sensing panel). The touch sensing unit TSU is provided between the polarizing member POL and the window WD. The touch sensing unit TSU may be flexible.

The touch sensing unit TSU is bent along the bending axis BX in the first mode along with the display panel DP, the first adhesive member AD1, the polarizing member POL, the second adhesive member AD2, and the window WD, and the touch sensing unit TSU is unbent (e.g., is flat or substantially flat) in the second mode.

The touch sensing unit TSU includes a bending area TBF and non-bending areas TNBF1 and TNBF2. The bending area TBF is connected to (extends from) the non-bending areas TNBF1 and TNBF2. The touch sensing unit TSU may include a plurality of non-bending areas TNBF1 and TNBF2. In one embodiment, the touch sensing unit TSU may include two non-bending areas TNBF1 and TNBF2. The non-bending areas TNBF1 and TNBF2 may include a first non-bending area TNBF1 connected to (extending from) an end of the bending area TBF and a second non-bending area TNBF2 connected to (extending from) the other end of the bending area TBF.

The bending area TBF is bent along the bending axis BX in the first mode, and the bending area TBF is unbent (e.g., is flat or substantially flat) in the second mode. In each of the first mode and the second mode, the non-bending areas TNBF1 and TNBF2 are not bent (e.g., are flat or substantially flat). In each of the first mode and the second mode, the non-bending areas TNBF1 and TNBF2 may be flat or slightly bent. In FIG. 6A, a distance between the first non-bending area TNBF1 and the second non-bending area TNBF2 is illustrated as being constant with respect to the bending axis BX, but embodiments of the present disclosure are not limited thereto. For example, the distance between the first non-bending area TNBF1 and the second non-bending area TNBF2, which are bent to face each other, may vary. Moreover, in FIG. 6A, surface areas of the first non-bending area TNBF1 and the second non-bending area TNBF2, which are bent to face each other, are illustrated as being the same as each other when the touch sensing unit TSU is bent along the bending axis BX, but embodiments of the present disclosure are not limited thereto. For example, the surface areas of the first non-bending area TNBF1 and the second non-bending area TNBF2, which are bent to face each other, may be different from each other.

The touch sensing unit TSU may directly contact the polarizing member POL. For example, the touch sensing unit TSU may be provided on the polarizing member POL without an intervening adhesive member. In one embodiment, the touch sensing unit TSU may be provided on the polarizing member POL by using a deposition method, but embodiments of the present disclosure are not limited thereto.

Figure 7A:
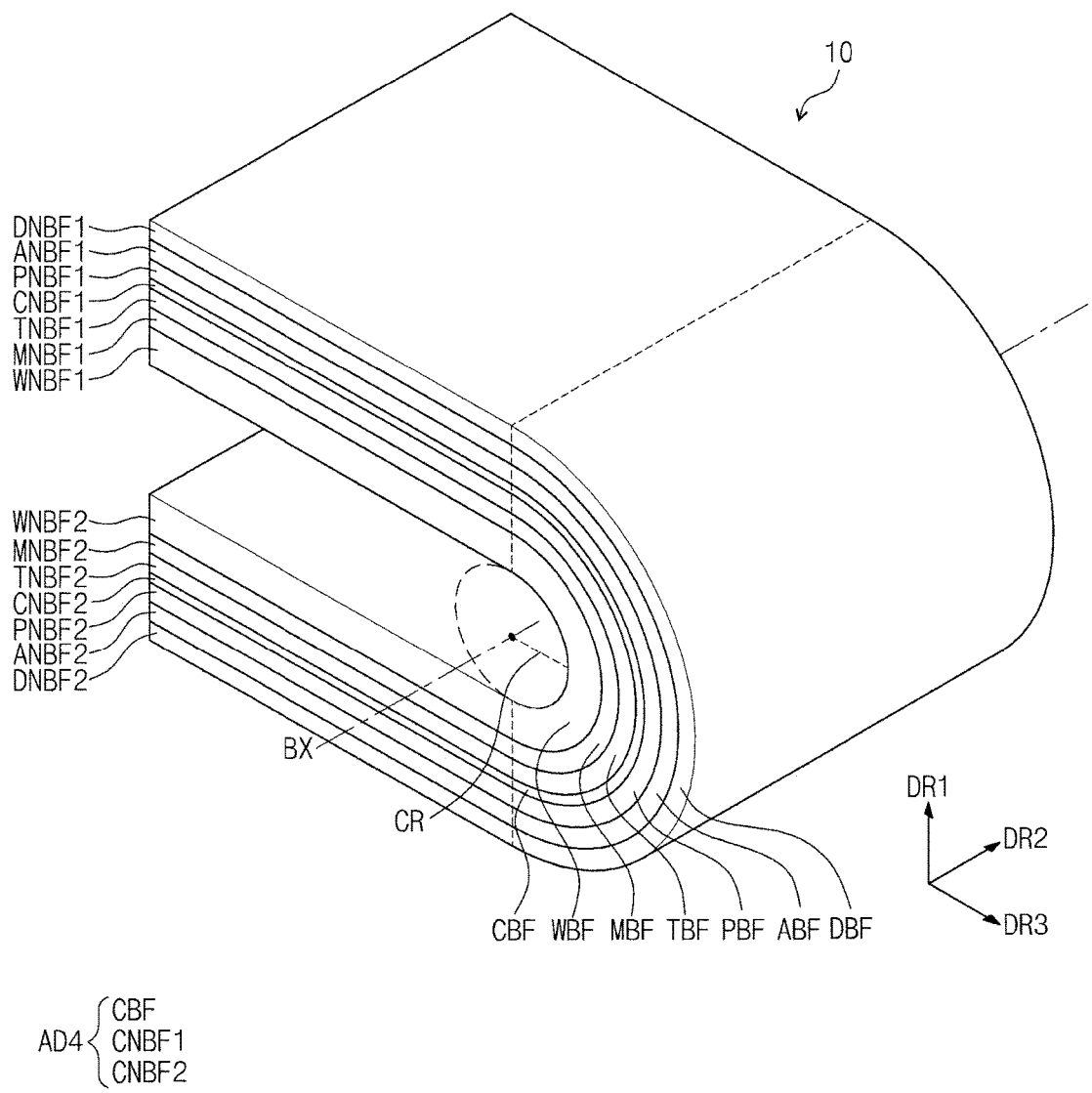
FIG. 7A is a schematic perspective view of a foldable display device in a bent state according to an embodiment of the present disclosure.
Figure 7B:
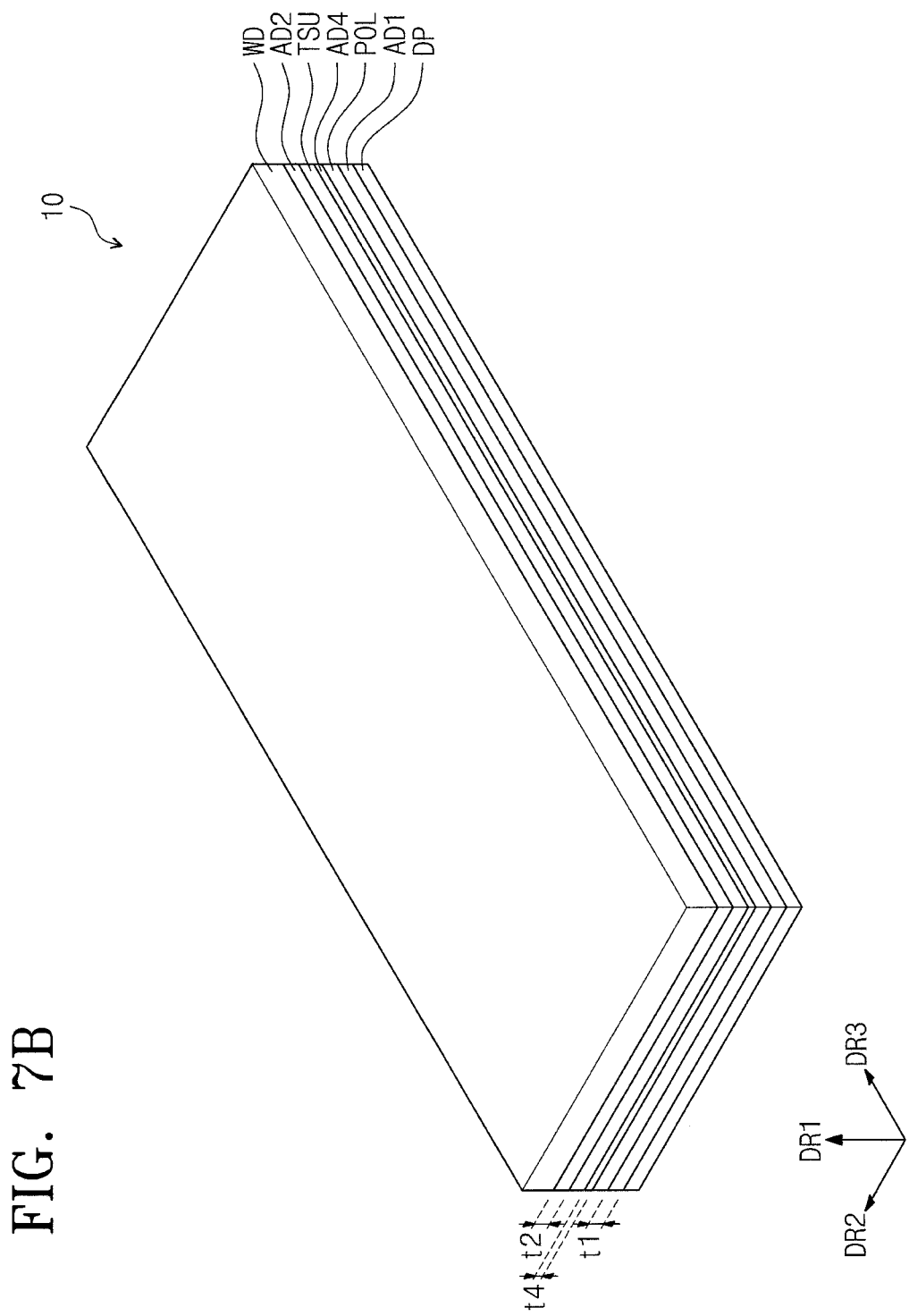
FIG. 7B is a schematic perspective view of a foldable display device in an unbent state according to an embodiment of the present disclosure.

FIG. 7A is a schematic perspective view of a foldable display device in a bent state according to an embodiment of the present disclosure. FIG. 7B is a schematic perspective view of a foldable display device in an unbent state according to an embodiment of the present disclosure.

Referring to FIGS. 1, 7A, and 7B, a fourth adhesive member AD4 may be further included between the polarizing member POL and the touch sensing unit TSU.

The fourth adhesive member AD4 is bent along the bending axis BX in the first mode along with the display panel DP, the first adhesive member AD1, the polarizing member POL, the second adhesive member AD2, the window WD, and the touch sensing unit TSU, and the fourth adhesive member AD4 is unbent (e.g., is flat or substantially flat) in the second mode.

The fourth adhesive member AD4 includes a bending area CBF and non-bending areas CNBF1 and CNBF2. The bending area CBF is connected to (extends from) the non-bending areas CNBF1 and CNBF2. For example, the fourth adhesive member AD4 may include a plurality of non-bending areas CNBF1 and CNBF2. In one embodiment, the fourth adhesive member AD4 may include two non-bending areas CNBF1 and CNBF2. The non-bending areas CNBF1 and CNBF2 may include a first non-bending area CNBF1 connected to (extending from) an end of the bending area CBF and a second non-bending area CNBF2 connected to (extending from) the other end of the bending area CBF.

The bending area CBF is bent along the bending axis BX in the first mode, and the bending area CBF is unbent (e.g., is flat or substantially flat) in the second mode. In each of the first mode and the second mode, the non-bending areas CNBF1 and CNBF2 are not bent (e.g., are flat or substantially flat). In each of the first mode and the second mode, the non-bending areas CNBF1 and CNBF2 may be flat or slightly bent. In FIG. 7A, a distance between the first non-bending area CNBF1 and the second non-bending area CNBF2 is illustrated as being constant with respect to the bending axis BX, but embodiments of the present disclosure are not limited thereto. For example, the distance between the first non-bending area CNBF1 and the second non-bending area CNBF2, which are bent to face each other, may vary. Moreover, in FIG. 7A, surface areas of the first non-bending area CNBF1 and the second non-bending area CNBF2, which are bent to face each other, are illustrated as being the same as each other when the fourth adhesive member AD4 is bent along the bending axis BX, but embodiments of the present disclosure are not limited thereto. For example, the surface areas of the first non-bending area CNBF1 and the second non-bending area CNBF2, which are bent to face each other, may be different from each other.

A thickness t4 of the fourth adhesive member AD4 may be less than the thickness t1 of the first adhesive member AD1. The thickness t4 of the fourth adhesive member AD4 may be less than the thickness t2 of the second adhesive member AD2. For example, the fourth adhesive member AD4 may have a thickness of at least about 10 μm and less than about 25 μm, but the present disclosure is not limited thereto.

The fourth adhesive member AD4 may have a storage modulus in a range of about $5 \times 10^4$ Pa to about $5 \times 10^5$ Pa at about −25° C. When the storage modulus for the fourth adhesive member AD4 is in the above range at about −25° C., the fourth adhesive member AD4 may be sufficiently adhesive while being easily bent into the first mode by an external force.

The foldable display device according to embodiments of the present disclosure reduces the occurrence of interlayer peeling under relatively high temperature and/or high humidity conditions. Consequently, the durability and reliability of the foldable display device according to embodiments of the present disclosure is improved.

Hereinafter, embodiments of the present disclosure are described in greater detail through specific examples and comparative examples. The below embodiments are merely examples for assisting in the understanding of the present disclosure, and the scope of the present disclosure is not limited thereto.

Experimental Example 1

The generation of micro-bubbles in a second adhesive member was measured under conditions of a temperature of 60° C. and humidity of 93% with the display device in a bent state such that a radius of curvature of the display device was 3 mm. The results are displayed in Table 1.

TABLE 1

|  | Comparative Example 1 | Comparative Example 2 | Comparative Example 3 | Example 1 |
|---|---|---|---|---|
| Storage modulus at 60° C. | $3.3 \times 10^4$ Pa | $4.0 \times 10^4$ Pa | $4.2 \times 10^4$ Pa | $5.0 \times 10^4$ |
| Generation of micro-bubbles | ◯ | ◯ | ◯ | X |

Referring to Table 1, micro-bubbles were not generated under the relatively high temperature/high humidity conditions in Example 1 in which the storage modulus of the second adhesive member was in the range of $4.5 \times 10^4$ Pa to $6.5 \times 10^4$ Pa at 60° C., but micro-bubbles were generated in Comparative Examples 1-3 in which the storage modulus of the second adhesive member was outside of (e.g., was below) the range of $4.5 \times 10^4$ Pa to $6.5 \times 10^4$ Pa at 60° C. From the results in Table 1, it may be seen that the display device according to an embodiment of the present disclosure, in which the storage modulus of the second adhesive member is in the range of $4.5 \times 10^4$ Pa to $6.5 \times 10^4$ Pa at 60° C. prevents or reduces the generation of micro-bubbles.

Experimental Example 2

A display panel was disposed on a 50 µm thick polyimide film using a pressure-sensitive adhesive, and a polarizing member was disposed on the display panel using a first adhesive member, which is a pressure-sensitive adhesive. Next, a touch sensing unit was disposed on the polarizing member using a pressure-sensitive adhesive, and a 130 µm thick window was disposed on the touch sensing unit using a second adhesive member, which is a pressure-sensitive adhesive.

Changing the conditions of the first adhesive member and the second adhesive member, the occurrence of interlayer peeling was measured under conditions of a temperature of 60° C. and humidity of 93% with the display device in a bent state such that the radius of curvature of the display device was 3 mm. The results are displayed in Table 2.

TABLE 2

|  | Comparative Example 4 | | Example 2 | |
| --- | --- | --- | --- | --- |
|  | First adhesive member | Second adhesive member | First adhesive member | Second adhesive member |
| Thickness (µm) | 100 | 50 | 50 | 50 |
| Modulus    −20° C. | $9.0 \times 10^4$ | $1.3 \times 10^5$ | $2.2 \times 10^5$ | $9.0 \times 10^4$ |
| (Pa)            60° C. | $5.0 \times 10^4$ | $4.0 \times 10^4$ | $3.5 \times 10^4$ | $5.0 \times 10^4$ |
| Stress-relaxation ratio (%) | 50 | 44 | 47 | 50 |
| Occurrence of interlayer peeling | Peeling occurred within 24 hours in a bent state | | Peeling did not occur for at least 240 hours in a bent state | |

Referring to Table 2, interlayer peeling did not occur for at least 240 hours in a bent state under relatively high temperature/high humidity conditions in Example 2 in which the stress-relaxation ratio of the first adhesive member was in a range of more than 40 and less than 50 and the storage modulus of the second adhesive member was in a range of $4.5 \times 10^4$ Pa to $6.5 \times 10^4$ Pa at 60° C. However, interlayer peeling occurred within 24 hours in a bent state under relatively high temperature/high humidity conditions in Comparative Example 4 when the stress-relaxation ratio of the first adhesive member was not in the range of more than 40 and less than 50 and the storage modulus of the second adhesive member was not in (e.g., was below) the range of $4.5 \times 10^4$ Pa to $6.5 \times 10^4$ Pa at 60° C. From the results in Table 2, it may be seen that the display device according to embodiments of the present disclosure in which the stress-relaxation ratio of the first adhesive member is in the range of more than 40 and less than 50 and the storage modulus of the second adhesive member is in the range of $4.5 \times 10^4$ Pa to $6.5 \times 10^4$ Pa at 60° C. has greater durability and improved reliability under relatively high temperature/high humidity conditions.

Experimental Example 3

Fixing the conditions for a second adhesive member and changing the conditions for a first adhesive member, the occurrence of interlayer peeling was measured under conditions of a temperature of 60° C. and humidity of 93% with a display device in a bent state such that the radius of curvature of the display device was 3 mm. The results are displayed in Table 3.

TABLE 3

|  | Second adhesive member | | Comparative Example 5 First adhesive member | Example 3 First adhesive member |
| --- | --- | --- | --- | --- |
| Thickness (µm) | 50 | Thickness (µm) | 50 | 50 |
| Modulus    −20° C. | $9.0 \times 10^4$ | Stress relaxation rate (%) | 0.53 | 0.47 |
| (Pa)            60° C. | $5.0 \times 10^4$ | | | |
| Stress relaxation rate (%) | 50 | | | |
| Occurrence of interlayer peeling | | | Peeling occurred within 72 hours in a bent state | Peeling did not occur for at least 240 hours in a bent state |

Referring to Table 3, interlayer peeling did not occur for at least 240 hours in a bent state under relatively high temperature/high humidity conditions in Example 3 in which the stress-relaxation ratio of the first adhesive member was in the range of more than 40 and less than 50 and the storage modulus of the second adhesive member was in the range of $4.5 \times 10^4$ Pa to $6.5 \times 10^4$ Pa at 60° C. However, interlayer peeling occurred within 72 hours in a bent state under relatively high temperature/high humidity conditions in Comparative Example 5 in which the storage modulus of the second adhesive member was in the range of $4.5 \times 10^4$ Pa to $6.5 \times 10^4$ Pa at 60° C. but the stress-relaxation ratio of the first adhesive member was not in the range of more than 40 and less than 50. From the results in Table 3, it may be seen that the improved durability is realized when the stress-relaxation ratio of the first adhesive member and the storage modulus of the second adhesive member at 60° C. are in the respective ranges of values according to embodiments of the present disclosure.

Experimental Example 4

Decreasing the residual strain of a first adhesive member at 60° C., the occurrence of interlayer peeling was measured when a display device was unbent (e.g., was flat or substantially flat) after being left under (after being subjected to) conditions of a temperature of 60° C. and humidity of 93% in a bent state such that the radius of curvature of the display device was 3 mm. The results are displayed in Table 4.

TABLE 4

|  | Comparative Example 6 | Comparative Example 7 | Comparative Example 8 | Example 4 |
| --- | --- | --- | --- | --- |
| Residual strain (%) | 17 | 12 | 10 | 6.3 |
| Occurrence of peeling | ○ | ○ | ○ | X |

Referring to Table 4, interlayer peeling did not occur when the display device was unbent after being bent under relatively high temperature/high humidity conditions in Example 4 in which the residual strain (%) of the second adhesive member was in the range of about 5 to about 8, but interlayer peeling occurred when the display device was unbent after being bent under relatively high temperature/high humidity conditions in Comparative Examples 6-8 in which the residual strain (%) of the second adhesive member was not in (e.g., was outside of) the range of about 5 to about 8. From the results in Table 4, it may be seen that the display device according to embodiments of the present disclosure in which the residual strain (%) of the second adhesive member is in the range of about 5 to about 8 has greater durability and improved reliability under relatively high temperature/high humidity conditions.

In a foldable display device according to embodiments of the present disclosure, the occurrence of peeling under relatively high temperature/high humidity conditions may be reduced.

The durability of a foldable display device according to embodiments of the present disclosure under relatively high temperature/high humidity conditions may be improved.

Embodiments of the present invention have been described above with reference to the accompanying drawings. However, it is understood by a person with ordinary skill in the art that the present invention may also be embodied in other forms without changing or departing from the technical spirit and/or scope of the present invention as defined by the appended claims and their equivalents. Therefore, it is understood that the above-described embodiments are exemplary and are not limiting.

What is claimed is:

1. A foldable display device comprising:
    a display panel;
    a polarizing member on the display panel;
    a window on the polarizing member;
    a first adhesive member between the display panel and the polarizing member; and
    a second adhesive member between the polarizing member and the window,
    wherein, in a first state, the display panel, the polarizing member, the window, the first adhesive member, and the second adhesive member are bent along a bending axis such that the window is closer to the bending axis than the display panel is,
    wherein each of the first adhesive member and the second adhesive member has a storage modulus in a range of $5\times10^4$ Pa to $5\times10^5$ Pa at $-25°$ C.,
    wherein the second adhesive member has a storage modulus in a range of $4.5\times10^4$ Pa to $6.5\times10^4$ Pa at $60°$ C.,
    wherein the first adhesive member has a stress-relaxation ratio that is greater than 40 and less than 50, the stress-relaxation ratio being defined as Stress-relaxation ratio (%)=$100\times G(t2)/G(t1)$, wherein $G(t1)$ is an initial stress-relaxation modulus measured in a state in which the first adhesive member is 600 μm thick, the initial stress-relaxation modulus being measured with a rheometer in a stress-relaxation test mode when a strain of 25% is removed after being applied using a parallel plate for 100 seconds at $60°$ C., and $G(t2)$ is a stress-relaxation modulus measured after the strain is applied to the first adhesive member for 300 seconds,
    wherein the first adhesive member has a residual strain in a range of 5 to 8 at $60°$ C., the residual strain being defined as Residual strain (%)=$L2/L1\times100$, and wherein L1 is a maximum creep strain for a state in which the first adhesive member is prepared to be 600 μm and when a stress of 2000 Pa is applied to the first adhesive member for 1 hour at $60°$ C. using a rheometer, and L2 is unrecovered residual recovery strain that remains along with elastic recovery strain that is recovered when the applied stress is removed after achieving the maximum creep strain.

2. The foldable display device of claim 1, wherein, in a second state, the display panel, the polarizing member, the window, the first adhesive member, and the second adhesive member are unbent.

3. The foldable display device of claim 1, wherein the first adhesive member has a thickness in a range of 25 μm to 100 μm.

4. The foldable display device of claim 1, wherein the second adhesive member has a thickness in a range of 25 μm to 100 μm.

5. The foldable display device of claim 1, wherein the first adhesive member has a peel strength of at least 800 gf/in.

6. The foldable display device of claim 1, wherein the second adhesive member has a peel strength of at least 800 gf/in.

7. The foldable display device of claim 1, wherein the first adhesive member comprises a first silicone-based base polymer, a first adhesion imparting agent, and a first cross-linking agent, and
    wherein the second adhesive member comprises a second silicone-based base polymer, a second adhesion imparting agent, and a second cross-linking agent.

8. The foldable display device of claim 1, further comprising:
    a protective film below the display panel; and
    a third adhesive member between the display panel and the protective film,
    wherein, in the first state, the protective film and the third adhesive member are bent along the bending axis and, in a second state, are unbent.

9. The foldable display device of claim 8, wherein a thickness of the third adhesive member is less than a thickness of each of the first adhesive member and the second adhesive member.

10. The foldable display device of claim 8, wherein the third adhesive member has a storage modulus in a range of $5\times10^4$ Pa to $5\times10^5$ Pa at $-25°$ C.

11. The foldable display device of claim 1, further comprising a touch sensing unit between the polarizing member and the window,
    wherein, in the first state, the touch sensing unit is bent along the bending axis and, in a second state, is unbent.

12. The foldable display device of claim 11, further comprising a fourth adhesive member between the polarizing member and the touch sensing unit,
    wherein, in the first state, the fourth adhesive member is bent along the bending axis and, in a second state, is unbent.

13. The foldable display device of claim 12, wherein a thickness of the fourth adhesive member is less than a thickness of each of the first adhesive member and the second adhesive member.

14. The foldable display device of claim 12, wherein the fourth adhesive member has a storage modulus in a range of $5\times10^4$ Pa to $5\times10^5$ Pa at $-25°$ C.

15. The foldable display device of claim 11, wherein the touch sensing unit directly contacts the polarizing member.

16. A foldable display device comprising:
    a display panel;
    a polarizing member on the display panel;
    a window on the polarizing member;
    a first adhesive member between the display panel and the polarizing member; and
    a second adhesive member between the polarizing member and the window,
    wherein, in a first state, the display panel, the polarizing member, the window, the first adhesive member, and the second adhesive member are bent along a bending axis such that the window is closer to the bending axis than the display panel is, wherein each of the first adhesive member and the second adhesive member has a storage modulus in a range of $5 \times 10^4$ Pa to $5 \times 10^5$ Pa at $-25°$ C., wherein the first adhesive member has a stress-relaxation ratio that is greater than 40 and less than 50, the stress-relaxation ratio being defined as Stress-relaxation ratio (%)=$100 \times G(t2)/G(t1)$, wherein $G(t1)$ is an initial stress-relaxation modulus measured in a state in which the first adhesive member is 600 μm thick, the initial stress-relaxation modulus being measured with a rheometer in a stress-relaxation test mode when a strain of 25% is removed after being applied using a parallel plate for 100 seconds at 60° C., and $G(t2)$ is a stress-relaxation modulus measured after the strain is applied to the first adhesive member for 300 seconds, wherein the first adhesive member has a residual strain in a range of 5 to 8 at 60° C., the residual strain being defined as Residual strain (%)=$L2/L1 \times 100$, and wherein L1 is a maximum creep strain for a state in which the first adhesive member is prepared to be 600 μm and when a stress of 2000 Pa is applied to the first adhesive member for 1 hour at 60° C. using a rheometer, and L2 is unrecovered residual recovery strain that remains along with elastic recovery strain that is recovered when the applied stress is removed after achieving the maximum creep strain.

* * * * *